United States Patent
Chen et al.

(10) Patent No.: US 7,780,785 B2
(45) Date of Patent: Aug. 24, 2010

(54) GAS DELIVERY APPARATUS FOR ATOMIC LAYER DEPOSITION

(75) Inventors: Ling Chen, Sunnyvale, CA (US); Vincent Ku, San Jose, CA (US); Dien-Yeh Wu, San Jose, CA (US); Hua Chung, San Jose, CA (US); Alan Ouye, San Mateo, CA (US); Norman Nakashima, Sunnyvale, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 360 days.

(21) Appl. No.: 10/281,079

(22) Filed: Oct. 25, 2002

(65) Prior Publication Data

US 2003/0121608 A1 Jul. 3, 2003

Related U.S. Application Data

(63) Continuation-in-part of application No. 10/032,284, filed on Dec. 21, 2001.

(60) Provisional application No. 60/397,230, filed on Jul. 19, 2002, provisional application No. 60/346,086, filed on Oct. 26, 2001.

(51) Int. Cl.
  C23C 16/455 (2006.01)
  C23F 1/00 (2006.01)
  H01L 21/306 (2006.01)
  C23C 16/06 (2006.01)
  C23C 16/22 (2006.01)

(52) U.S. Cl. ................... 118/715; 156/345.33

(58) Field of Classification Search ............... 118/715, 118/728, 50; 156/345.29, 345.33
See application file for complete search history.

(56) References Cited

U.S. PATENT DOCUMENTS 3,291,456 A * 12/1966 Deane .................. 366/165.1
4,033,287 A *  7/1977 Alexander et al. ....... 118/723 E
4,058,430 A    11/1977 Suntola et al. ......... 427/255.13
4,270,999 A *  6/1981 Hassan et al. .......... 204/192.32

(Continued)

FOREIGN PATENT DOCUMENTS

CN        1244037        2/2000

(Continued)

OTHER PUBLICATIONS

Klaus, et al. "Atomically Controlled Growth of Tungsten Nitride Using Sequential Surface Reactions," Applied Surface Science, 162-163 (2000) 479-491.

(Continued)

Primary Examiner—Rudy Zervigon
(74) Attorney, Agent, or Firm—Patterson & Sheridan, LLP

(57) ABSTRACT

An apparatus and method for performing a cyclical layer deposition process, such as atomic layer deposition is provided. In one aspect, the apparatus includes a substrate support having a substrate receiving surface, and a chamber lid comprising a tapered passageway extending from a central portion of the chamber lid and a bottom surface extending from the passageway to a peripheral portion of the chamber lid, the bottom surface shaped and sized to substantially cover the substrate receiving surface. The apparatus also includes one or more valves coupled to the gradually expanding channel, and one or more gas sources coupled to each valve.

26 Claims, 14 Drawing Sheets

U.S. PATENT DOCUMENTS

| | | | | |
|---|---|---|---|---|
| 4,389,973 A | 6/1983 | Suntola et al. ............... 118/725 |
| 4,413,022 A | 11/1983 | Suntola et al. ................ 117/89 |
| 4,415,275 A | 11/1983 | Dietrich .................... 366/165.1 |
| 4,597,405 A * | 7/1986 | Oetiker et al. ................. 137/14 |
| 4,614,639 A | 9/1986 | Hegedus ................ 422/186.05 |
| 4,732,110 A | 3/1988 | Parsons ...................... 118/719 |
| 4,761,269 A * | 8/1988 | Conger et al. ............... 118/679 |
| 4,813,846 A | 3/1989 | Helms |
| 4,834,831 A | 5/1989 | Nishizawa et al. ............ 117/93 |
| 4,907,534 A | 3/1990 | Huang et al. ................ 118/725 |
| 4,917,556 A | 4/1990 | Stark et al. |
| 4,951,601 A | 8/1990 | Maydan et al. |
| 4,975,252 A | 12/1990 | Nishizawa et al. .......... 118/688 |
| 4,987,856 A | 1/1991 | Hey et al. ................ 118/723 E |
| 4,991,542 A | 2/1991 | Kohmura et al. ......... 118/723 E |
| 4,993,357 A | 2/1991 | Scholz ....................... 118/715 |
| 5,000,113 A | 3/1991 | Wang et al. .............. 118/723 E |
| 5,027,746 A | 7/1991 | Frijlink ...................... 118/724 |
| 5,028,565 A | 7/1991 | Chang et al. |
| 5,091,217 A * | 2/1992 | Hey et al. ................ 427/248.1 |
| 5,173,327 A | 12/1992 | Sandhu et al. ............... 438/680 |
| 5,173,474 A | 12/1992 | Connell et al. |
| 5,186,718 A | 2/1993 | Tepman et al. |
| 5,204,145 A | 4/1993 | Gasworth .................... 427/577 |
| 5,205,077 A | 4/1993 | Wittstock |
| 5,221,449 A | 6/1993 | Colgan et al. .......... 204/192.15 |
| 5,225,366 A | 7/1993 | Yoder ......................... 117/90 |
| 5,234,561 A | 8/1993 | Randhawa et al. |
| 5,259,881 A | 11/1993 | Edwards et al. |
| 5,261,959 A | 11/1993 | Gasworth .................... 118/719 |
| 5,264,038 A | 11/1993 | Hara et al. .................. 118/719 |
| 5,281,274 A | 1/1994 | Yoder ......................... 118/697 |
| 5,281,485 A | 1/1994 | Colgan et al. |
| 5,286,296 A | 2/1994 | Sato et al. |
| 5,294,286 A | 3/1994 | Nishizawa et al. ............ 117/93 |
| 5,306,666 A | 4/1994 | Izumi ......................... 438/680 |
| 5,338,362 A | 8/1994 | Imahashi .................... 118/719 |
| 5,338,363 A | 8/1994 | Kawata et al. .............. 118/725 |
| 5,338,364 A | 8/1994 | Kurihara et al. ............. 118/729 |
| 5,374,570 A | 12/1994 | Nasu et al. .................... 438/30 |
| 5,441,703 A | 8/1995 | Jürgensen .................... 422/129 |
| 5,443,647 A | 8/1995 | Aucoin et al. ......... 118/723 ME |
| 5,480,818 A | 1/1996 | Matsumoto et al. ......... 438/150 |
| 5,483,919 A | 1/1996 | Yokoyama et al. ............ 117/89 |
| 5,496,410 A | 3/1996 | Fukuda et al. .............. 118/725 |
| 5,503,875 A | 4/1996 | Imai et al. ............... 427/255.39 |
| 5,580,380 A | 12/1996 | Liu et al. |
| 5,609,689 A | 3/1997 | Kato et al. |
| 5,667,592 A | 9/1997 | Boitnott et al. |
| 5,674,786 A | 10/1997 | Turner et al. ................ 438/758 |
| 5,695,564 A | 12/1997 | Imahashi |
| 5,711,811 A | 1/1998 | Suntola et al. ............... 118/719 |
| 5,730,801 A | 3/1998 | Tepman et al. |
| 5,730,802 A | 3/1998 | Ishizumi et al. ............. 118/719 |
| 5,788,447 A | 8/1998 | Yonemitsu et al. |
| 5,788,799 A | 8/1998 | Steger et al. |
| 5,796,116 A | 8/1998 | Nakata et al. ................. 257/66 |
| 5,801,634 A | 9/1998 | Young et al. |
| 5,804,488 A | 9/1998 | Shih et al. ................... 438/396 |
| 5,807,792 A | 9/1998 | Ilg et al. ...................... 438/758 |
| 5,838,677 A | 11/1998 | Kozaki et al. ............... 370/389 |
| 5,846,330 A | 12/1998 | Quirk et al. ............ 118/723 DC |
| 5,855,680 A | 1/1999 | Soininen et al. ............. 118/719 |
| 5,856,219 A | 1/1999 | Naito et al. |
| 5,866,213 A | 2/1999 | Foster et al. |
| 5,866,795 A | 2/1999 | Wang et al. |
| 5,879,459 A | 3/1999 | Gadgil et al. ............... 118/715 |
| 5,882,165 A | 3/1999 | Maydan et al. |
| 5,882,413 A | 3/1999 | Beaulieu et al. |
| 5,888,303 A | 3/1999 | Dixon ........................ 118/715 |
| 5,916,365 A | 6/1999 | Sherman ..................... 117/92 |
| 5,923,056 A | 7/1999 | Lee et al. ..................... 257/192 |
| 5,928,389 A | 7/1999 | Jevtic |
| 5,951,771 A | 9/1999 | Raney et al. .......... 118/723 ER |
| 5,972,430 A | 10/1999 | DiMeo, Jr. et al. ..... 425/255.32 |
| 5,996,528 A | 12/1999 | Berrian et al. ........... 118/723 E |
| 6,015,590 A | 1/2000 | Suntola et al. ......... 427/255.23 |
| 6,015,917 A | 1/2000 | Bhandari et al. .............. 556/12 |
| 6,042,652 A | 3/2000 | Hyun et al. ................. 118/719 |
| 6,051,286 A | 4/2000 | Zhao et al. |
| 6,062,798 A | 5/2000 | Muka |
| 6,066,358 A | 5/2000 | Guo et al. |
| 6,071,572 A | 6/2000 | Mosely et al. ............... 427/570 |
| 6,071,808 A | 6/2000 | Merchant et al. |
| 6,084,302 A | 7/2000 | Sandhu ....................... 257/751 |
| 6,086,677 A | 7/2000 | Umotoy et al. |
| 6,110,556 A | 8/2000 | Bang et al. |
| 6,117,244 A | 9/2000 | Bang et al. |
| 6,124,158 A | 9/2000 | Dautartas et al. ............ 438/216 |
| 6,139,700 A | 10/2000 | Kang et al. ............. 204/192.17 |
| 6,140,237 A | 10/2000 | Chan et al. |
| 6,140,238 A | 10/2000 | Kitch |
| 6,143,077 A | 11/2000 | Ikeda et al. ................. 118/715 |
| 6,143,659 A | 11/2000 | Leem |
| 6,144,060 A | 11/2000 | Park et al. ................... 257/310 |
| 6,158,446 A | 12/2000 | Mohindra et al. |
| 6,174,377 B1 | 1/2001 | Doering et al. ............. 118/729 |
| 6,174,809 B1 | 1/2001 | Kang et al. ................. 438/682 |
| 6,179,920 B1 | 1/2001 | Tarutani et al. ............. 118/715 |
| 6,183,563 B1 | 2/2001 | Choi et al. .................. 118/715 |
| 6,197,683 B1 | 3/2001 | Kang et al. ................. 438/643 |
| 6,200,893 B1 | 3/2001 | Sneh ........................... 438/685 |
| 6,203,613 B1 | 3/2001 | Gates et al. .................. 117/104 |
| 6,206,967 B1 | 3/2001 | Mak et al. |
| 6,207,006 B1 * | 3/2001 | Katoh .................... 156/345.29 |
| 6,207,487 B1 | 3/2001 | Kim et al. ................... 438/238 |
| 6,218,298 B1 | 4/2001 | Hoinkis ....................... 438/675 |
| 6,218,302 B1 | 4/2001 | Braeckelmann et al. |
| 6,231,672 B1 | 5/2001 | Choi et al. .................. 118/715 |
| 6,270,572 B1 | 8/2001 | Kim et al. ..................... 117/93 |
| 6,271,148 B1 | 8/2001 | Kao et al. .................... 438/727 |
| 6,284,646 B1 | 9/2001 | Leem .......................... 438/629 |
| 6,287,965 B1 | 9/2001 | Kang et al. ................. 438/648 |
| 6,302,965 B1 * | 10/2001 | Umotoy et al. .............. 118/715 |
| 6,305,314 B1 | 10/2001 | Sneh et al. .............. 118/723 R |
| 6,306,216 B1 | 10/2001 | Kim et al. ................... 118/725 |
| 6,333,260 B1 | 12/2001 | Kwon et al. ................ 438/643 |
| 6,334,983 B1 | 1/2002 | Okayama et al. ........ 422/186.29 |
| 6,335,280 B1 | 1/2002 | van der Jeugd ............. 438/674 |
| 6,342,277 B1 | 1/2002 | Sherman ..................... 427/562 |
| 6,348,376 B2 | 2/2002 | Lim et al. ................... 438/253 |
| 6,355,561 B1 | 3/2002 | Sandhu et al. .............. 438/676 |
| 6,358,829 B2 | 3/2002 | Yoon et al. .................. 438/597 |
| 6,368,954 B1 | 4/2002 | Lopatin et al. .............. 438/627 |
| 6,369,430 B1 | 4/2002 | Adetutu et al. .............. 257/382 |
| 6,372,598 B2 | 4/2002 | Kang et al. ................. 438/399 |
| 6,379,748 B1 | 4/2002 | Bhandari et al. ....... 427/255.394 |
| 6,391,785 B1 | 5/2002 | Satta et al. .................. 438/704 |
| 6,399,491 B2 | 6/2002 | Jeon et al. ................... 438/680 |
| 6,416,577 B1 | 7/2002 | Suntoloa et al. .............. 117/88 |
| 6,416,822 B1 | 7/2002 | Chiang et al. ............... 427/561 |
| 6,420,189 B1 | 7/2002 | Lopatin ......................... 438/2 |
| 6,423,619 B1 | 7/2002 | Grant et al. ................. 438/589 |
| 6,428,859 B1 | 8/2002 | Chiang et al. ............... 427/457 |
| 6,436,193 B1 | 8/2002 | Kasai et al. ................. 118/715 |
| 6,447,607 B2 | 9/2002 | Soininen et al. ............. 117/200 |
| 6,447,933 B1 | 9/2002 | Wang et al. ................. 428/635 |
| 6,451,119 B2 | 9/2002 | Sneh et al. .................. 118/715 |
| 6,451,695 B2 | 9/2002 | Sneh ........................... 438/685 |
| 6,468,924 B2 | 10/2002 | Lee et al. ..................... 438/763 |
| 6,475,276 B1 | 11/2002 | Elers et al. .................... 117/84 |
| 6,475,910 B1 | 11/2002 | Sneh ........................... 438/685 |
| 6,478,872 B1 | 11/2002 | Chae et al. .................... 117/88 |
| 6,481,945 B1 | 11/2002 | Hasper et al. ............... 414/217 |

| | | | | | | |
|---|---|---|---|---|---|---|
| 6,482,262 B1 | 11/2002 | Elers et al. ............. 117/84 | | 2002/0066411 A1 | 6/2002 | Chiang et al. ............. 118/724 |
| 6,482,733 B2 | 11/2002 | Raaijmakers et al. ....... 438/633 | | 2002/0068458 A1 | 6/2002 | Chiang et al. ............. 438/694 |
| 6,482,740 B2 | 11/2002 | Soininen et al. ............. 438/686 | | 2002/0073924 A1 | 6/2002 | Chiang et al. ............. 118/723 R |
| 6,511,539 B1 | 1/2003 | Raaijmakers ............. 117/102 | | 2002/0076481 A1 | 6/2002 | Chiang et al. ............. 427/8 |
| 6,534,395 B2 | 3/2003 | Werkhoven et al. ......... 438/627 | | 2002/0076507 A1 | 6/2002 | Chiang et al. ............. 427/569 |
| 6,551,406 B2 | 4/2003 | Kilpi ............. 118/728 | | 2002/0076508 A1 | 6/2002 | Chiang et al. ............. 427/569 |
| 6,551,929 B1 | 4/2003 | Kori et al. ............. 438/685 | | 2002/0076837 A1 | 6/2002 | Hujanen et al. ............. 438/3 |
| 6,562,140 B1 | 5/2003 | Bondestam et al. | | 2002/0086106 A1 | 7/2002 | Park et al. ............. 427/248.1 |
| 6,569,501 B2 | 5/2003 | Chiang et al. ............. 427/535 | | 2002/0086111 A1 | 7/2002 | Byun et al. ............. 427/255.394 |
| 6,572,705 B1 | 6/2003 | Suntola et al. | | 2002/0086507 A1 | 7/2002 | Park et al. ............. 438/585 |
| 6,575,705 B2 | 6/2003 | Akiyama et al. ............. 417/198 | | 2002/0090829 A1 | 7/2002 | Sandhu et al. ............. 438/761 |
| 6,578,287 B2 | 6/2003 | Aswad ............. 34/367 | | 2002/0092471 A1 | 7/2002 | Kang et al. ............. 118/715 |
| 6,579,372 B2 | 6/2003 | Park ............. 118/715 | | 2002/0094689 A1 | 7/2002 | Park ............. 438/694 |
| 6,585,823 B1 | 7/2003 | Van Wijck ............. 117/89 | | 2002/0098627 A1 | 7/2002 | Pomarede et al. ............. 438/149 |
| 6,593,484 B2 | 7/2003 | Yasuhara et al. ............. 556/42 | | 2002/0104481 A1 | 8/2002 | Chiang et al. ............. 118/723 I |
| 6,596,602 B2 | 7/2003 | Iizuka et al. ............. 438/396 | | 2002/0105088 A1 | 8/2002 | Yang et al. ............. 257/774 |
| 6,599,572 B2 | 7/2003 | Saanila et al. ............. 427/249.18 | | 2002/0106536 A1 | 8/2002 | Lee et al. ............. 428/702 |
| 6,607,976 B2 | 8/2003 | Chen et al. ............. 438/627 | | 2002/0106846 A1 | 8/2002 | Seutter et al. ............. 438/200 |
| 6,620,723 B1 | 9/2003 | Byun et al. ............. 438/627 | | 2002/0108570 A1 | 8/2002 | Lindfors ............. 118/715 |
| 6,630,030 B1 | 10/2003 | Suntola et al. ............. 118/728 | | 2002/0109168 A1 | 8/2002 | Kim et al. ............. 257/295 |
| 6,630,201 B2 | 10/2003 | Chiang et al. ............. 427/255.28 | | 2002/0110991 A1 | 8/2002 | Li ............. 562/575 |
| 6,632,279 B1 | 10/2003 | Ritala et al. ............. 117/101 | | 2002/0115886 A1 | 8/2002 | Yasuhara et al. ............. 438/347 |
| 6,660,126 B2 | 12/2003 | Nguyen et al. ............. 156/345.34 | | 2002/0117399 A1 | 8/2002 | Chen et al. ............. 205/125 |
| 6,686,271 B2 | 2/2004 | Raaijmakers et al. ....... 438/633 | | 2002/0121241 A1 | 9/2002 | Nguyen et al. |
| 6,716,287 B1 | 4/2004 | Santiago et al. ............. 118/729 | | 2002/0121342 A1 | 9/2002 | Nguyen et al. |
| 6,718,126 B2 | 4/2004 | Lei ............. 392/388 | | 2002/0127336 A1 | 9/2002 | Chen et al. ............. 427/250 |
| 6,734,020 B2 | 5/2004 | Lu et al. ............. 436/55 | | 2002/0127745 A1 | 9/2002 | Lu et al. ............. 438/14 |
| 6,772,072 B2 | 8/2004 | Ganguli et al. ............. 702/24 | | 2002/0134307 A1 | 9/2002 | Choi ............. 118/715 |
| 6,773,507 B2 | 8/2004 | Jallepally et al. ............. 117/84 | | 2002/0144655 A1 | 10/2002 | Chiang et al. |
| 6,777,352 B2 | 8/2004 | Tepman et al. ............. 438/784 | | 2002/0144657 A1 | 10/2002 | Chiang et al. |
| 6,778,762 B1 | 8/2004 | Shareef et al. ............. 392/416 | | 2002/0146511 A1 | 10/2002 | Chiang et al. |
| 6,815,285 B2 | 11/2004 | Choi et al. ............. 438/231 | | 2002/0155722 A1 | 10/2002 | Satta et al. |
| 6,818,094 B2 | 11/2004 | Yudovsky ............. 156/345.1 | | 2002/0162506 A1 | 11/2002 | Sneh et al. |
| 6,821,563 B2 | 11/2004 | Yudovsky ............. 427/248.1 | | 2002/0164421 A1 | 11/2002 | Chiang et al. ............. 427/248.1 |
| 6,866,746 B2 | 3/2005 | Lei et al. ............. 156/345.29 | | 2002/0164423 A1 | 11/2002 | Chiang et al. ............. 427/255.28 |
| 6,868,859 B2 | 3/2005 | Yudovsky ............. 137/1 | | 2002/0177282 A1 | 11/2002 | Song ............. 438/300 |
| 2001/0000866 A1 | 5/2001 | Sneh et al. ............. 118/723 R | | 2002/0182320 A1 | 12/2002 | Leskela et al. ............. 427/250 |
| 2001/0002280 A1 | 5/2001 | Sneh ............. 427/255.28 | | 2002/0187256 A1 | 12/2002 | Elers et al. ............. 427/96.8 |
| 2001/0009140 A1 | 7/2001 | Bondestam et al. ......... 118/725 | | 2002/0197402 A1 | 12/2002 | Chiang et al. ............. 427/255.39 |
| 2001/0009695 A1 | 7/2001 | Saanila et al. ............. 427/255.39 | | 2003/0004723 A1 | 1/2003 | Chihara |
| 2001/0011526 A1 | 8/2001 | Doering et al. ............. 118/729 | | 2003/0010451 A1 | 1/2003 | Tzu et al. |
| 2001/0013312 A1 | 8/2001 | Soininen et al. ............. 117/86 | | 2003/0013320 A1 | 1/2003 | Kim et al. ............. 438/778 |
| 2001/0014371 A1 | 8/2001 | Kilpi ............. 427/255.28 | | 2003/0017697 A1 | 1/2003 | Choi et al. ............. 438/679 |
| 2001/0024387 A1 | 9/2001 | Raaijmakers et al. ........ 365/200 | | 2003/0019428 A1 | 1/2003 | Ku et al. |
| 2001/0025979 A1 | 10/2001 | Kim et al. ............. 257/315 | | 2003/0023338 A1 | 1/2003 | Chin et al. |
| 2001/0028924 A1 | 10/2001 | Sherman ............. 427/255.28 | | 2003/0031807 A1 | 2/2003 | Elers et al. ............. 427/569 |
| 2001/0029094 A1 | 10/2001 | Mee-Young et al. ......... 438/597 | | 2003/0042630 A1 | 3/2003 | Babcoke et al. |
| 2001/0034123 A1 | 10/2001 | Jeon et al. ............. 438/643 | | 2003/0049931 A1 | 3/2003 | Byun et al. ............. 438/649 |
| 2001/0041250 A1 | 11/2001 | Werkhoven et al. ......... 428/212 | | 2003/0049942 A1 | 3/2003 | Haukka et al. ............. 438/778 |
| 2001/0042523 A1 | 11/2001 | Kesala ............. 122/6.6 | | 2003/0053799 A1 | 3/2003 | Lei |
| 2001/0042799 A1 | 11/2001 | Kim et al. ............. 239/553 | | 2003/0057526 A1 | 3/2003 | Chung et al. ............. 257/642 |
| 2001/0054377 A1 | 12/2001 | Lindfors et al. ............. 117/104 | | 2003/0057527 A1 | 3/2003 | Chung et al. ............. 257/642 |
| 2001/0054730 A1 | 12/2001 | Kim et al. ............. 257/301 | | 2003/0059538 A1 | 3/2003 | Chung et al. ............. 427/304 |
| 2001/0054769 A1 | 12/2001 | Raaijmakers et al. ........ 257/758 | | 2003/0072913 A1 | 4/2003 | Chou et al. ............. 428/114 |
| 2002/0000196 A1 | 1/2002 | Park ............. 118/715 | | 2003/0072975 A1 | 4/2003 | Shero et al. ............. 428/704 |
| 2002/0000598 A1 | 1/2002 | Kang et al. ............. 257/301 | | 2003/0075273 A1 | 4/2003 | Kilpela et al. ............. 156/345.33 |
| 2002/0004293 A1 | 1/2002 | Soininen et al. ............. 438/584 | | 2003/0075925 A1 | 4/2003 | Lindors et al. ............. 285/367 |
| 2002/0007790 A1 | 1/2002 | Park ............. 118/715 | | 2003/0079686 A1 | 5/2003 | Chen et al. ............. 118/715 |
| 2002/0009544 A1 | 1/2002 | McFeely et al. ............. 427/248.1 | | 2003/0082296 A1 | 5/2003 | Elers et al. ............. 427/96 |
| 2002/0009896 A1 | 1/2002 | Sandhu et al. ............. 438/758 | | 2003/0082301 A1 | 5/2003 | Chen et al. ............. 427/255.28 |
| 2002/0017242 A1 | 2/2002 | Hamaguchi et al. ......... 118/715 | | 2003/0082307 A1 | 5/2003 | Chung et al. ............. 427/402 |
| 2002/0019121 A1 | 2/2002 | Pyo ............. 438/618 | | 2003/0089308 A1 | 5/2003 | Raaijmakers et al. ....... 117/200 |
| 2002/0020869 A1 | 2/2002 | Park et al. ............. 257/306 | | 2003/0101927 A1 | 6/2003 | Raaijmakers ............. 117/200 |
| 2002/0021544 A1 | 2/2002 | Cho et al. ............. 361/200 | | 2003/0101938 A1 | 6/2003 | Ronsse et al. ............. 118/726 |
| 2002/0031618 A1 | 3/2002 | Sherman ............. 427/569 | | 2003/0104126 A1 | 6/2003 | Fang et al. ............. 427/255.392 |
| 2002/0037630 A1 | 3/2002 | Argawal et al. ............. 438/430 | | 2003/0106490 A1 | 6/2003 | Jallepally et al. |
| 2002/0041931 A1 | 4/2002 | Suntola et al. ............. 427/255.28 | | 2003/0108674 A1 | 6/2003 | Chung et al. ............. 427/255.394 |
| 2002/0048635 A1 | 4/2002 | Kim et al. ............. 427/331 | | 2003/0113187 A1 | 6/2003 | Lei et al. |
| 2002/0048880 A1 | 4/2002 | Lee ............. 438/253 | | 2003/0116087 A1 | 6/2003 | Nguyen et al. ............. 118/715 |
| 2002/0052097 A1 | 5/2002 | Park ............. 438/507 | | 2003/0121469 A1 | 7/2003 | Lindfors et al. ............. 117/105 |
| 2002/0055235 A1 | 5/2002 | Agarwal et al. ............. 438/430 | | 2003/0121608 A1 | 7/2003 | Chen et al. |
| 2002/0060363 A1 | 5/2002 | Xi et al. ............. 257/751 | | 2003/0124262 A1 | 7/2003 | Chen et al. |
| 2002/0061612 A1 | 5/2002 | Sandhu et al. ............. 438/151 | | 2003/0129826 A1 | 7/2003 | Werkhoven et al. ......... 438/627 |

| | | | | | |
|---|---|---|---|---|---|
| 2003/0134508 A1 | 7/2003 | Raaijmakers et al. ........ 438/638 | JP | 63-266814 | 11/1988 |
| 2003/0140854 A1 | 7/2003 | Kilpi ......................... 118/715 | JP | 64-009895 | 1/1989 |
| 2003/0143328 A1 | 7/2003 | Chen et al. ............. 427/255.28 | JP | 64-009896 | 1/1989 |
| 2003/0143747 A1 | 7/2003 | Bondestam et al. ............ 436/34 | JP | 64-009897 | 1/1989 |
| 2003/0143839 A1 | 7/2003 | Raaijmakers et al. ........ 438/633 | JP | 64-037832 | 2/1989 |
| 2003/0153177 A1 | 8/2003 | Tepman et al. .............. 438/656 | JP | 64-082615 | 3/1989 |
| 2003/0168750 A1 | 9/2003 | Basceri et al. ...................... 1/1 | JP | 64-082617 | 3/1989 |
| 2003/0172872 A1 | 9/2003 | Thakur et al. ............... 118/715 | JP | 64-082671 | 3/1989 |
| 2003/0173586 A1 | 9/2003 | Moriwaki et al. ........... 257/200 | JP | 64-082676 | 3/1989 |
| 2003/0186495 A1 | 10/2003 | Saanila et al. ............... 438/200 | JP | 01-103982 | 4/1989 |
| 2003/0190423 A1 | 10/2003 | Yang et al. ............. 427/255.28 | JP | 01-103996 | 4/1989 |
| 2003/0190804 A1 | 10/2003 | Glenn et al. ................. 438/689 | JP | 64-090524 | 4/1989 |
| 2003/0194493 A1 | 10/2003 | Chang et al. | JP | 01-117017 | 5/1989 |
| 2003/0198754 A1 | 10/2003 | Xi et al. | JP | 01-143221 | 6/1989 |
| 2003/0205729 A1 | 11/2003 | Basceri et al. ............... 257/200 | JP | 01-143233 | 6/1989 |
| 2003/0213560 A1 | 11/2003 | Wang et al. | JP | 01-154511 | 6/1989 |
| 2003/0213987 A1 | 11/2003 | Basceri et al. ............... 257/296 | JP | 01-245512 | 9/1989 |
| 2003/0216981 A1 | 11/2003 | Tillman ......................... 705/34 | JP | 01-236657 | 10/1989 |
| 2003/0221780 A1 | 12/2003 | Lei et al. ................ 156/345.29 | JP | 01-264218 | 10/1989 |
| 2003/0224107 A1 | 12/2003 | Lindfors et al. ......... 427/255.28 | JP | 01-270593 | 10/1989 |
| 2003/0224578 A1 | 12/2003 | Chung et al. ................. 438/424 | JP | 01-272108 | 10/1989 |
| 2003/0224600 A1 | 12/2003 | Cao et al. .................... 438/684 | JP | 01-290221 | 11/1989 |
| 2003/0235961 A1 | 12/2003 | Metzner et al. .............. 438/424 | JP | 01-290222 | 11/1989 |
| 2004/0005749 A1 | 1/2004 | Choi et al. ................... 438/197 | JP | 01-296673 | 11/1989 |
| 2004/0009307 A1 | 1/2004 | Koh et al. .................... 427/569 | JP | 01-303770 | 12/1989 |
| 2004/0011404 A1 | 1/2004 | Ku et al. ...................... 137/341 | JP | 01-305894 | 12/1989 |
| 2004/0011504 A1 | 1/2004 | Ku et al. | JP | 01-313927 | 12/1989 |
| 2004/0013577 A1 | 1/2004 | Ganguli et al. | JP | 02-012814 | 1/1990 |
| 2004/0014320 A1 | 1/2004 | Chen et al. ................... 438/692 | JP | 02-014513 | 1/1990 |
| 2004/0015300 A1 | 1/2004 | Ganguli et al. | JP | 02-017634 | 1/1990 |
| 2004/0016404 A1 | 1/2004 | Gregg et al. ................. 118/726 | JP | 02-063115 | 3/1990 |
| 2004/0018304 A1 | 1/2004 | Chung et al. ................. 427/250 | JP | 02-074029 | 3/1990 |
| 2004/0018723 A1 | 1/2004 | Byun et al. ................... 438/643 | JP | 02-074587 | 3/1990 |
| 2004/0018747 A1 | 1/2004 | Lee et al. ..................... 438/761 | JP | 02-106822 | 4/1990 |
| 2004/0025370 A1 | 2/2004 | Guenther ....................... 34/576 | JP | 02-129913 | 5/1990 |
| 2004/0033698 A1 | 2/2004 | Lee et al. ..................... 438/758 | JP | 02-162717 | 6/1990 |
| 2004/0046197 A1 | 3/2004 | Basceri et al. ............... 257/296 | JP | 02-172895 | 7/1990 |
| 2004/0065255 A1 | 4/2004 | Yang et al. ................... 118/715 | JP | 02-196092 | 8/1990 |
| 2004/0069227 A1 | 4/2004 | Ku et al. ...................... 118/721 | JP | 02-203517 | 8/1990 |
| 2004/0071897 A1 | 4/2004 | Verplancken et al. ........ 427/569 | JP | 02-230690 | 9/1990 |
| 2004/0144308 A1 | 7/2004 | Yudovsky .................... 118/715 | JP | 02-230722 | 9/1990 |
| 2004/0144311 A1 | 7/2004 | Chen et al. ................... 118/715 | JP | 02-246161 | 9/1990 |
| 2004/0219784 A1 | 11/2004 | Kang et al. .................. 438/653 | JP | 02-264491 | 10/1990 |
| 2004/0224506 A1 | 11/2004 | Choi et al. ................... 438/680 | JP | 02-283084 | 11/1990 |
| 2004/0235285 A1 | 11/2004 | Kang et al. .................. 438/597 | JP | 02-304916 | 12/1990 |
| 2005/0006799 A1 | 1/2005 | Gregg et al. ............... 261/119.1 | JP | 03-019211 | 1/1991 |
| 2005/0059240 A1 | 3/2005 | Choi et al. ................... 438/679 | JP | 03-022569 | 1/1991 |
| 2005/0095859 A1 | 5/2005 | Chen et al. ................... 438/689 | JP | 03-023294 | 1/1991 |
| 2005/0104142 A1 | 5/2005 | Narayanan et al. ........... 257/412 | JP | 03-023299 | 1/1991 |

FOREIGN PATENT DOCUMENTS

| | | |
|---|---|---|
| EP | 0 429 270 | 5/1991 |
| EP | 0 497 267 | 8/1992 |
| EP | 1 077 484 A2 | 2/2001 |
| EP | 1 167 569 | 1/2002 |
| GB | 2 355 727 | 5/2001 |
| JP | 58-098917 | 6/1983 |
| JP | 58-100419 | 6/1983 |
| JP | 61-035847 | 2/1986 |
| JP | 61-210623 | 9/1986 |
| JP | 62-069508 | 3/1987 |
| JP | 62-141717 | 6/1987 |
| JP | 62-167297 | 7/1987 |
| JP | 62-171999 | 7/1987 |
| JP | 62-232919 | 10/1987 |
| JP | 63-062313 | 3/1988 |
| JP | 63-085098 | 4/1988 |
| JP | 63-090833 | 4/1988 |
| JP | 63-222420 | 9/1988 |
| JP | 63-222421 | 9/1988 |
| JP | 63-227007 | 9/1988 |
| JP | 63-252420 | 10/1988 |
| JP | 03-044967 | 2/1991 |
| JP | 03-070124 | 3/1991 |
| JP | 03-185716 | 8/1991 |
| JP | 03-208885 | 9/1991 |
| JP | 03-234025 | 10/1991 |
| JP | 03-286522 | 12/1991 |
| JP | 04-031391 | 2/1992 |
| JP | 04-031396 | 2/1992 |
| JP | 4087323 | 3/1992 |
| JP | 04-100292 | 4/1992 |
| JP | 04-111418 | 4/1992 |
| JP | 04-132214 | 5/1992 |
| JP | 04-132681 | 5/1992 |
| JP | 04-151822 | 5/1992 |
| JP | 04-162418 | 6/1992 |
| JP | 04-175299 | 6/1992 |
| JP | 04-186824 | 7/1992 |
| JP | 04-212411 | 8/1992 |
| JP | 04-260696 | 9/1992 |
| JP | 04-273120 | 9/1992 |
| JP | 04-291916 | 9/1992 |
| JP | 04-285167 | 10/1992 |
| JP | 04-325500 | 11/1992 |
| JP | 04-328874 | 11/1992 |

| | | |
|---|---|---|
| JP | 05-029228 | 2/1993 |
| JP | 05-047665 | 2/1993 |
| JP | 05-047666 | 2/1993 |
| JP | 05-047668 | 2/1993 |
| JP | 05-074717 | 3/1993 |
| JP | 05-074724 | 3/1993 |
| JP | 05-102189 | 4/1993 |
| JP | 05-160152 | 6/1993 |
| JP | 05-175143 | 7/1993 |
| JP | 05-175145 | 7/1993 |
| JP | 05-182906 | 7/1993 |
| JP | 05-186295 | 7/1993 |
| JP | 05-206036 | 8/1993 |
| JP | 05-234899 | 9/1993 |
| JP | 05-235047 | 9/1993 |
| JP | 05-251339 | 9/1993 |
| JP | 05-270997 | 10/1993 |
| JP | 05-283336 | 10/1993 |
| JP | 05-291152 | 11/1993 |
| JP | 05-304334 | 11/1993 |
| JP | 05-343327 | 12/1993 |
| JP | 05-343685 | 12/1993 |
| JP | 06-045606 | 2/1994 |
| JP | 06-224138 | 5/1994 |
| JP | 06-177381 | 6/1994 |
| JP | 06-196809 | 7/1994 |
| JP | 06-222388 | 8/1994 |
| JP | 06-230421 | 8/1994 |
| JP | 06-252057 | 9/1994 |
| JP | 07-070752 | 3/1995 |
| JP | 07-086269 | 3/1995 |
| JP | 06-132236 | 7/1995 |
| JP | 07-300649 A | 11/1995 |
| JP | 08-181076 | 7/1996 |
| JP | 08-245291 | 9/1996 |
| JP | 08-264530 | 10/1996 |
| JP | 09-260786 | 10/1997 |
| JP | 09-293681 | 11/1997 |
| JP | 10-190128 | 7/1998 |
| JP | 11-269652 | 10/1999 |
| JP | 2000-031387 | 1/2000 |
| JP | 2000-058777 | 2/2000 |
| JP | 2000-068072 | 3/2000 |
| JP | 2000-319772 | 3/2000 |
| JP | 2000-138094 | 5/2000 |
| JP | 2000-212752 | 8/2000 |
| JP | 2000-218445 | 8/2000 |
| JP | 2001-020075 | 11/2000 |
| JP | 2000-340883 | 12/2000 |
| JP | 2000-353666 | 12/2000 |
| JP | 2001020075 | 1/2001 |
| JP | 10-308283 | 3/2001 |
| JP | 2001-152339 | 4/2001 |
| JP | 2001-189312 | 5/2001 |
| JP | 2000-087029 | 6/2001 |
| JP | 2001-172767 | 6/2001 |
| JP | 2001-217206 | 8/2001 |
| JP | 2001-220287 | 8/2001 |
| JP | 2001-220294 | 8/2001 |
| JP | 2001-240972 | 9/2001 |
| JP | 2001-254181 | 9/2001 |
| JP | 2001-284042 | 10/2001 |
| JP | 2001-303251 | 10/2001 |
| JP | 2001-328900 | 11/2001 |
| JP | 10-188840 | 12/2001 |
| JP | 2001-111000 A | 12/2002 |
| WO | WO 90-02216 | 3/1990 |
| WO | 96/17107 | 6/1996 |
| WO | WO 96/17107 | 6/1996 |
| WO | WO 98-06889 | 2/1998 |
| WO | 98/51838 | 11/1998 |
| WO | 99/01595 | 1/1999 |
| WO | WO 99/01595 | 1/1999 |
| WO | WO 99-13504 | 3/1999 |
| WO | 99/29924 | 6/1999 |
| WO | 99/65064 | 12/1999 |
| WO | WO 99/65064 | 12/1999 |
| WO | 00/16377 | 3/2000 |
| WO | WO 00-11721 A1 | 3/2000 |
| WO | 00/54320 | 9/2000 |
| WO | WO 00-79576 A1 | 12/2000 |
| WO | 01/12891 | 2/2001 |
| WO | 01/15220 | 3/2001 |
| WO | 01/17692 | 3/2001 |
| WO | WO 01-17691 A1 | 3/2001 |
| WO | WO 01/17692 | 3/2001 |
| WO | 01/27347 | 4/2001 |
| WO | 01/29280 | 4/2001 |
| WO | 01/29893 | 4/2001 |
| WO | WO 01-27346 | 4/2001 |
| WO | WO 01/29891 | 4/2001 |
| WO | WO 01/29891 A1 | 4/2001 |
| WO | 01/36702 | 5/2001 |
| WO | 01/06832 | 9/2001 |
| WO | 02/01628 | 1/2002 |
| WO | 02/08485 | 1/2002 |
| WO | WO 02/08488 | 1/2002 |
| WO | WO 02/27078 A1 | 4/2002 |
| WO | 02/43115 | 5/2002 |
| WO | 02/45167 | 6/2002 |
| WO | 02/45871 | 6/2002 |
| WO | 02/067319 | 8/2002 |
| WO | WO 03/023835 A1 | 3/2003 |

OTHER PUBLICATIONS

Yang, et al. "Atomic Layer Deposition of Tungsten Film from WF6/B2H6: Nucleation Layer for Advanced Semiconductor Device," Conference Proceedings ULSI XVII (2002).

Kukli, et al. "Tailoring the Dielectric Properties of $HFO_2$-$Ta_2$-$O_5$ Nanolaminates," Applied Physics Letters, vol. 68, No. 26, Jun. 24, 1996; p. 3737-9.

Kukli, et al. "Atomic Layer Epitaxy Growth of Tantalum Oxide Thin Films from $Ta(OC_2H_5)_5$ and $H_2O$,".Journal of the Electrochemical Society, vol. 142, No. 5, May 1995; p. 1670-5.

Kukli, et al. "In Situ Study of Atomic Layer Epitaxy Growth of Tantalum Oxide Thin Films from $Ta(OC_2H_5)_5$ and $H_2O$," Applied Surface Science, vol. 112, Mar. 1997, p. 236-42.

Kukli, et al. "Properties of Ta2O5-Based Dielectric Nanolaminates Deposited by Atomic Layer Epitaxy," Journal of the Electrochemical Society, vol. 144, No. 1, Jan. 1997; p. 300-6.

Kukli, et al. "Properties of $(Nb_{1-x}Ta_x)_2O_5$ Solid Solutions and $(Nb_{1-x}Ta_x)_2O_5Z_1O_2$ Nanolaminates Grown by Atomic Layer Epitaxy," 1997; p. 785-93.

Ritala, et al. "Chemical Vapor Deposition," Jan. 1999, p. 6-9.

Rossnagel, et al. "Plasma-Enhanced Atomic Layer Deposition of Ta and Ti for Interconnect Diffusion Barriers," J. Vac. Sci. Tehnology B., vol. 18. No. 4 Jul. 2000, p. 2016-20.

Niinisto, et al. "Synthesis of Oxide Thin Films and Overlayers by Atomic Layer Epitaxy for Advanced Applications," Materials Science and Engineering B41 1996 p. 23-29.

Eisenbraum, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

Clark-Phelps, et al. "Engineered Tantalum Aluminate and Hafnium ALD Films for Ultrathin Dielectric Films with Improved Electrical and Thermal Properties," Mat. Res. Soc. Symp. Proc. vol. 670 (2001).

International Search Report from the European Patent Office for International Application No. PCT/US 02/34553, dated May 8, 2003.

International Search Report from the European Patent Office for International Application No. PCT/US 02/34277, dated May 9, 2003.

Rossnagel, et al.; "Plasma-enhanced atomic layer deposition of Ta and Ti for interconnect diffusion barriers," J. Vac. Sci. Technol. B, vol. 18 No. 4, Jul./Aug. 2000, pp. 2016-2020.

European Search Report dated Sep. 23, 2005 from European Application No. 03257169.7.

Ohba, et al., "Thermal Decomposition of Methylhydrazine and Deposition Properties of CVD TiN Thin Films", Conference Proceedings, Advanced Metallization for ULSI Applications in 1993 (1994), pp. 143-149.

Scheper, et al., "Low-temperature deposition of titanium nitride films from dialkylhydrazine-based precursors", Materials Science in Semiconductor Processing 2 (1999), pp. 149-157.

Suzuki, et al., "A 0.2-μm contact filing by 450° C.-hydrazine-reduced TiN film with low resistivity", IEDM 92-979, pp. 11.8.1-11.8.3.

Suzuki, et al., "LPCVD-TiN Using Hydrazine and $TiCl_4$", VMIC Conference (Jun. 8-9, 1993), pp. 418-423.

IBM Tech. Disc. Bull. Knowledge-Based Dynamic Scheduler in Distributed Computer Control, (Jun. 1990), pp. 80-84.

IBM Tech. Disc. Bull. "Multiprocessor and Multitasking Architecture for Tool Control of the Advanced via Inspection Tools" (May 1992), pp. 190-191.

McGeachin, S., "Synthesis and properties of some β-diketimines derived from acetylacetone, and their metal complexes", Canadian J. of Chemistry, vol. 46 (1968), pp. 1903-1912.

Solanki, et al., "Atomic Layer deposition of Copper Seed Layers", Electrochemical and Solid State Letters, 3(10) (2000), pp. 479-480.

NERAC.COM Retro Search: Atomic Layer Deposition of Copper, dated Oct. 11, 2001.

NERAC.COM Retro Search: Atomic Layer Deposition / Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and semiconductors and copper.

NERAC Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149-154.

Choi, et al., "The effect of annealing on resistivity of low pressure chemical vapor depositied titanium diboride", J. Appl. Phys. 69(11) (Jun. 1, 1991), pp. 7853-7861.

Choi, et al., "Stability of $TiB_2$ as a Diffusion Barrier on Silicon", J. Electrochem. Soc. 138(10) (Oct. 1991), pp. 3062-3067.

Maydan, "Cluster Tools for Fabrication of Advanced devices" Jap. J. of Applied Physics, Extended Abstracts, $22^{nd}$ Conference Solid State Devices and Materials (1990), pp. 849-852.

"Applications of Integrated processing", Solid State Technology, US, Cowan Pub., vol. 37, No. 12 (Dec. 1, 1994), pp. 45-47.

Kitigawa, et al., "Hydrogen-mediated low temperature epitaxy of Si in plasma-enhanced chemical vapor deposition", Applied Surface Science (2000), pp. 30-34.

Lee, et al., "Pulsed nucleation for ultra-high aspect ratio tungsten plugfill", Novellus Systems, Inc. (2001), pp. 649-654.

Partial Search Report (Annex to Form PCT/ISA/206), dated Oct. 25, 2002 for PCT/US02/02651.

Ritala, M., et al. "Controlled growth of TaN, $Ta_3N_5$, and $TaO_xN_y$ thin films by atomic layer deposition," Chem. Mater., vol. 11, No. 7, 1999 pp. 1712-1718.

Leskela, M., et al. "Atomic layer epitaxy in deposition of various oxide and nitride thin films," Colloque C5, supplement au Journal de Physique II, vol. 5, Jun. 1995 pp. 937-951.

Hiltunen, L., et al. "Nitrides of titanium, niobium, tantalum and molybdenum grown as thin films by the atomic layer epitaxy method," Thin Solid Films, 166 (1988) 149-154.

Korean Office Action dated Sep. 11, 2009 for Application No. 10-2004-7006217.

Notice of Reasons for Rejection dated Mar. 3, 2009 for Japanese Application No. 2003/538423.

* cited by examiner

GAS DELIVERY APPARATUS FOR ATOMIC LAYER DEPOSITION

CROSS-REFERENCE TO RELATED APPLICATIONS

This application claims benefit of U.S. Provisional Patent Application Ser. No. 60/397,230, filed on Jul. 19, 2002, and entitled "Improved Deposition Apparatus", which is incorporated by reference herein. This application also claims benefit of U.S. Provisional Patent Application Ser. No. 60/346,086, filed on Oct. 26, 2001, and entitled "Method and Apparatus for ALD Deposition", which is incorporated by reference herein. This application is also a continuation-in-part of U.S. patent application Ser. No. 10/032,284, filed on Dec. 21, 2001, and entitled "Gas Delivery Apparatus And Method For Atomic Layer Deposition", which is incorporated by reference herein.

BACKGROUND OF THE INVENTION

1. Field of the Invention

Embodiments of the present invention generally relate to an apparatus and method for atomic layer deposition. More particularly, embodiments of the present invention relate to an improved gas delivery apparatus and method for atomic layer deposition.

2. Description of the Related Art

Reliably producing sub-micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of vias, contacts, and other features, as well as the dielectric materials between them, decrease to sub-micron dimensions (e.g., less than 0.20 micrometers or less), whereas the thickness of the dielectric layers remains substantially constant, with the result that the aspect ratios for the features, i.e., their height divided by width, increase. Many traditional deposition processes have difficulty filling sub-micron structures where the aspect ratio exceeds 4:1, and particularly where the aspect ratio exceeds 10:1. Therefore, there is a great amount of ongoing effort being directed at the formation of substantially void-free and seam-free sub-micron features having high aspect ratios.

Atomic layer deposition is one deposition technique being explored for the deposition of material layers over features having high aspect ratios. One example of atomic layer deposition comprises the sequential introduction of pulses of gases. For instance, one cycle for the sequential introduction of pulses of gases may comprise a pulse of a first reactant gas, followed by a pulse of a purge gas and/or a pump evacuation, followed by a pulse of a second reactant gas, and followed by a pulse of a purge gas and/or a pump evacuation. The term "gas" as used herein is defined to include a single gas or a plurality gases. Sequential introduction of separate pulses of the first reactant and the second reactant may result in the alternating self-limiting adsorption of monolayers of the reactants on the surface of the substrate and, thus, forms a monolayer of material for each cycle. The cycle may be repeated to a desired thickness of the deposited material. A pulse of a purge gas and/or a pump evacuation between the pulses of the first reactant gas and the pulses of the second reactant gas serves to reduce the likelihood of gas phase reactions of the reactants due to excess amounts of the reactants remaining in the chamber.

However, there is a need for a new apparatus to perform gas delivery and to perform deposition of films by atomic layer deposition.

SUMMARY OF THE INVENTION

An apparatus and method for performing a cyclical layer deposition process, such as atomic layer deposition is provided. In one aspect, the apparatus includes a substrate support having a substrate receiving surface, and a chamber lid comprising a tapered passageway extending from a central portion of the chamber lid and a bottom surface extending from the passageway to a peripheral portion of the chamber lid, the bottom surface shaped and sized to substantially cover the substrate receiving surface. The apparatus also includes one or more valves coupled to the gradually expanding channel, and one or more gas sources coupled to each valve.

In another aspect, the apparatus includes a substrate support having a substrate receiving surface, a chamber lid comprising an expanding channel extending downwardly to a central portion of the chamber lid and comprising a conical bottom surface of the lid extending from the expanding channel to a peripheral portion of the chamber lid, and one or more gas conduits disposed around an upper portion of the expanding channel, wherein the one or more gas conduits are disposed at an angle from a center of the expanding channel. The apparatus also includes one or more valves coupled to the gradually expanding channel, and a choke disposed on the chamber lid adjacent a perimeter of the conical bottom surface.

In one aspect, the method comprises: providing one or more gases into the substrate processing chamber in an initial circular direction over a central portion of the substrate; reducing the velocity of the gases through non-adiabatic expansion; providing the gases to a central portion of the substrate; and directing the gases radially across the substrate from the central portion of the substrate to a peripheral portion of the substrate at a substantially uniform velocity.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
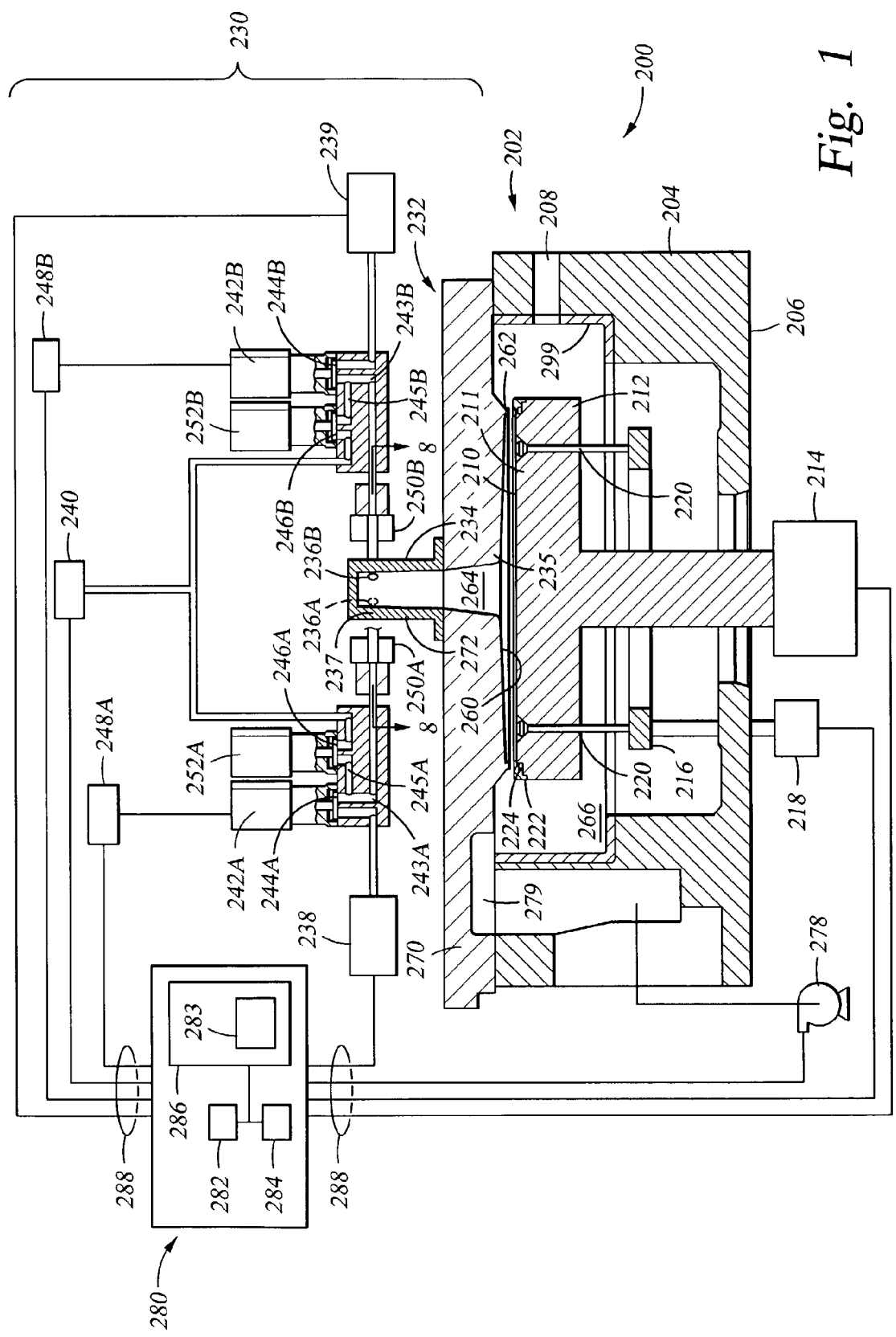
FIG. 1 is a schematic cross-sectional view of one embodiment of a chamber including a gas delivery apparatus adapted for atomic layer deposition.

FIG. 1 is a schematic partial, cross-sectional view of an exemplary processing system 200 capable of performing cyclical layer deposition, atomic layer deposition, digital chemical vapor deposition, and rapid chemical vapor deposition techniques. The terms "cyclical layer deposition", "atomic layer deposition", "digital chemical vapor deposition", and "rapid chemical vapor deposition" are used interchangeably herein and refer to gas phase deposition techniques whereby two or more compounds are sequentially introduced into a reaction zone of a processing chamber to deposit a thin layer of material on a substrate surface.

The chamber 200 includes a chamber body 202, a gas delivery system 230, a vacuum system 278, and a control unit 280. The chamber body 202 has sidewalls 204, a bottom 206, and a liner 299. A slit valve 208 is formed in a sidewall 204 of the chamber body 202 to provide access for a robot (not shown) to deliver and retrieve a substrate 210, such as a 200 mm or 300 mm semiconductor wafer or a glass substrate, from the chamber 200.

A substrate support 212 is disposed within the chamber body 202 to support a substrate 210 on a substrate receiving surface 211 thereon. A lift motor 214 raises and lowers the substrate support 212. A lift plate 216 connected to a lift motor 218 is mounted in the chamber 200 and raises and lowers pins 220 movably disposed through the substrate support 212. The pins 220 raise and lower the substrate 210 over the receiving surface 211 of the substrate support 212. The substrate support 212 may include a vacuum chuck, an electrostatic chuck, or a clamp ring for securing the substrate 212 to the substrate support 212 during processing. The substrate support 212 may also be heated to heat a substrate 210 disposed thereon. For example, the substrate support 212 may be heated using an embedded heating element, such as a resistive heater, or may be heated using radiant heat, such as heating lamps disposed above the substrate support 212.

The chamber body 202 also includes a purge ring 222 disposed on the substrate support 212 to define a purge channel 224. A purge gas flows through the purge channel 224 to a peripheral portion of the substrate 210 to prevent deposition thereon.

The vacuum system 278 is in communication with a pumping channel 279 formed within the sidewall 204 of the chamber body 202. The vacuum system 278 evacuates gases from the chamber body 202 and maintains a desired pressure or a desired pressure range inside a pumping zone 266 of the chamber 202. The pumping zone 266 is formed within the chamber body 202, surrounding the substrate support 212.

The gas delivery system 230 and the chamber body 202 define a reaction zone 264 within the chamber body 202. The reaction zone 264 is in fluid communication with the substrate support 212. More particularly, the reaction zone 264 includes any volume within the chamber 200 that is between a gas source and the substrate surface. A reactant gas or purge gas can adequately fill the reaction zone 264 and ensure sufficient exposure of the substrate 210 to the reactant gas or purge gas. In conventional chemical vapor deposition, prior art chambers are required to provide a combined flow of reactants simultaneously and uniformly to the entire surface of the substrate in order to ensure that the co-reaction of the reactants occur uniformly across the surface of the substrate. In atomic layer deposition, the chamber 200 sequentially introduces reactants to the substrate surface to provide adsorption of alternating thin layers of the reactants onto the surface of the substrate. As a consequence, atomic layer deposition does not require a flow of reactants which reach the surface of the substrate simultaneously. Instead, a flow of each reactant needs to be provided in an amount which is sufficient for a thin layer of the reactant to be adsorbed on the surface of the substrate.

Since the reaction zone 264 contains a smaller volume compared to an inner volume of a conventional CVD chamber, a smaller amount of gas is needed to fill the reaction zone 264 for a particular process. For example, in one embodiment, the volume of the reaction zone 264 is about 1000 $cm^3$ or less, preferably 500 $cm^3$ or less, and more preferably 200 $cm^3$ or less for a chamber adapted to process 200 mm diameter substrates. In one embodiment, the volume of the reaction zone 264 is about 3,000 $cm^3$ or less, preferably 1,500 $cm^3$ or less, and more preferably 600 $cm^3$ or less for a chamber adapted to process 300 mm diameter substrates. In one embodiment, the substrate support 212 may be raised or lowered to adjust the volume of the reaction zone 264 for deposition. Because of the smaller volume of the reaction zone 264, less gas, whether a deposition gas or a purge gas, is necessary to be flowed into the chamber 200. Therefore, the throughput of the chamber 200 is greater and waste may be minimized due to the smaller amount of gas used, reducing the cost of operation.

In the embodiment of FIG. 1, the gas delivery system 230 is disposed at an upper portion of the chamber body 202 to provide a gas, such as a process gas and/or a purge gas, to the chamber body 202. The gas delivery system 230 includes a chamber lid 232 and an expanding channel 234 formed therethrough. The chamber lid 232 includes a bottom surface 260 that is sized and shaped to substantially cover the substrate 210 disposed within the chamber body 202.

At least a portion of the bottom surface 260 of the chamber lid 232 may be tapered from the expanding channel 234 to a peripheral portion of the chamber lid 232 to provide an improved gas velocity profile across the surface of the substrate 210 (i.e., from the center of the substrate to the edge of the substrate). The bottom surface 260 may include one or more tapered surfaces, such as a straight surface, a concave surface, a convex surface, or combinations thereof. Preferably, the bottom surface 260 is tapered in the shape of a funnel. The ratio of the maximum area of the flow section over the minimum area of the flow section between a downwardly sloping bottom surface 260 of the chamber lid 232 and the surface of the substrate 210 is preferably less than about 2, more preferably less than about 1.5, more preferably less than about 1.3, and most preferably about 1.

Not wishing to be bound by theory, it is believed that a gas having an uniform velocity across the surface of the substrate 210 provides a more uniform deposition of the gas on the substrate 210. It is believed that the velocity of the gas is directly proportional to the concentration of the gas, which is in turn, directly proportional to the deposition rate of the gas on the substrate surface. Thus, a higher velocity of a gas at a first area of the surface of the substrate versus a second area of the surface of the substrate is believed to provide a higher deposition of the gas on the first area. Accordingly, it is believed that a chamber lid having a downwardly sloping bottom surface 260 provides a more uniform deposition of the gas across the surface of the substrate because the downwardly sloping bottom surface provides a more uniform velocity and, thus, a more uniform concentration of the gas across the surface of the substrate.

At least a section of the internal surface of the chamber lid 232, including the expanding channel 234 and the bottom surface 260, has a surface roughness (Ra μin) preferably between about 46 $R_a$ and 62 $R_a$, preferably about 54 $R_a$. In addition, an upper surface of the purge ring 222 and an upper surface of the chamber liner 299 may have a surface roughness between about 46 $R_a$ and 62 $R_a$, preferably about 54 $R_a$. It is believed that these surface roughnesses increase the adhesion of deposited film onto these surfaces. Increased adhesion of the deposited film reduces the likelihood that the deposited film will flake off during processing of substrates and, thus, reduces the likelihood of particle contamination of the substrates. In a preferred embodiment, the surface roughnesses are provided by electropolishing to provide a mirror polished surface. A mirror polished surface helps produce a laminar flow of a gas thereon. In other less preferred embodiments, the surface roughness can by provided by texturing the surface in a suitable lay.

Control of the chamber lid 232 temperature is important to prevent gas decomposition, deposition, or condensation on the chamber lid 232. Accordingly, the chamber lid 232 may include cooling elements and/or heating elements depending on the particular gas being delivered therethrough. For example, water channels (not shown) may be formed in the chamber lid 232 to cool the chamber lid 232. In another example, heating elements (not shown) may be embedded or may surround components of the chamber lid 232 to heat the chamber lid 232.

The chamber lid 232 may also include a chamber plate portion 270 and a cap portion 272. The cap portion 272 may be maintained at one temperature range and the plate portion 270 may be maintained at another temperature range. For example, the cap 272 may be heated using heater tape or any other heating device to prevent condensation of reactant gases while the plate portion 270 is maintained at ambient temperature. In another example, the cap 272 may be heated and the plate portion 270 may be cooled with water channels formed therethrough (not shown) to prevent thermal decomposition of reactant gases.

The chamber lid 232 may be made of stainless steel, aluminum, nickel-plated aluminum, nickel, or other suitable materials compatible with the processing to be performed. In one embodiment, the cap portion 272 comprises stainless steal and the chamber plate portion 270 comprises aluminum. In one embodiment, the additional plate comprises stainless steal. In one embodiment, the expanding channel 234 and the bottom surface 260 of the chamber lid 232 may comprise a mirror polished surface to help produce a laminar flow of a gas along the expanding channel 234 and the bottom surface 260 of the chamber lid 232. In another embodiment, the inner surface of the gas conduits 250A, 250B may be electropolished to help produce a laminar flow of a gas therethrough.

The chamber lid 232 may further include a choke 262 disposed at a peripheral portion of the chamber lid 232, adjacent the periphery of the substrate 210. The choke 262 may be any type of obstruction capable of restricting the flow of gas within the reaction zone 264 at an area adjacent the periphery of the substrate 210. The choke 262 helps maintain a substantially uniform pressure within the reaction zone 264.

Figure 2A:
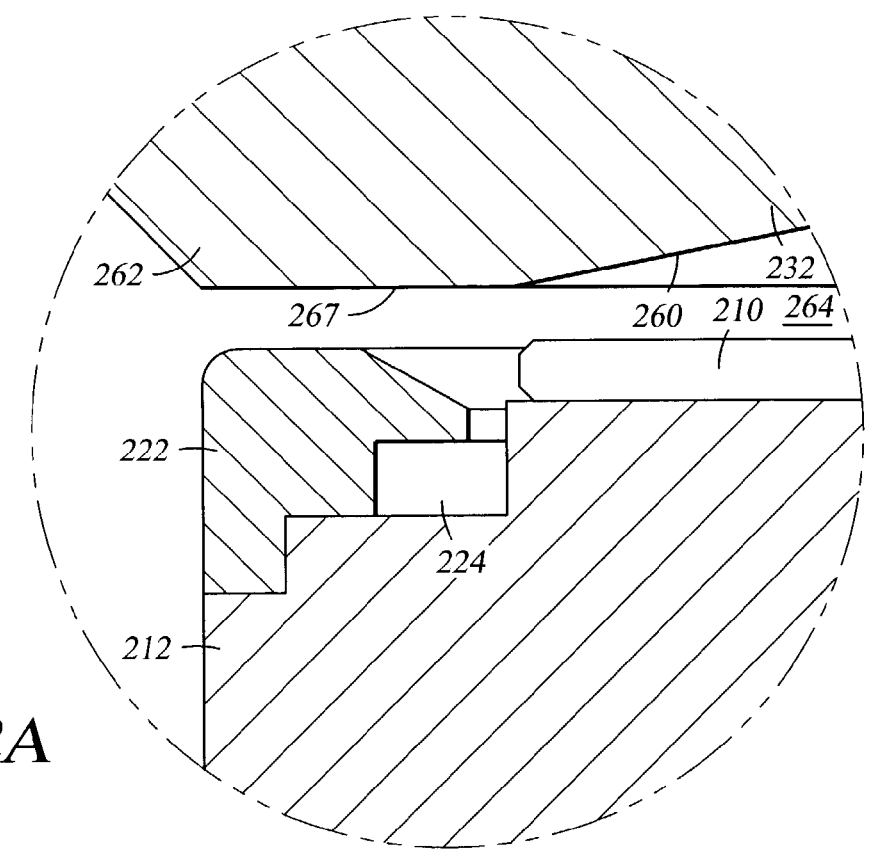
FIG. 2A is a schematic cross-sectional view of one embodiment of a choke disposed on a lower surface of a chamber lid.

For example, FIG. 2A shows a schematic cross-sectional view of one embodiment of the choke 262. In this embodiment, the choke 262 includes a circumferential lateral portion 267. In one aspect, the purge ring 222 may be adapted to direct a purge gas toward the lateral portion 267 of the choke 262.

Figure 2B:
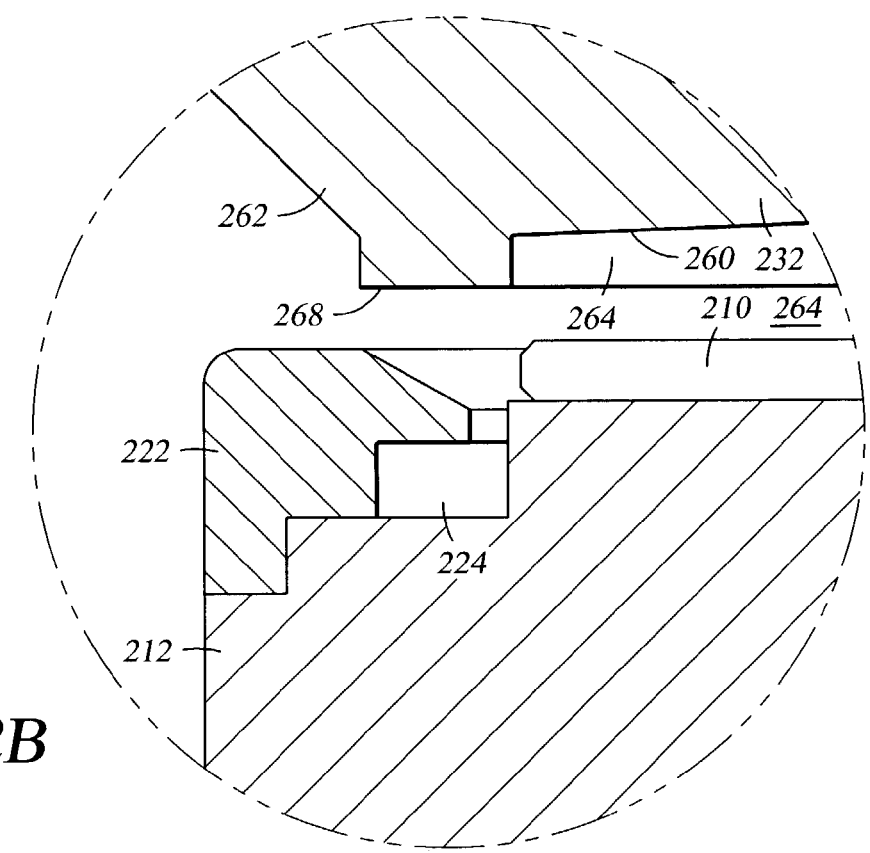
FIG. 2B is a cross-sectional view of an alternative embodiment of a choke disposed on a lower surface of a chamber lid.

As another example, FIG. 2B shows a schematic cross-sectional view of another embodiment of the choke 262. The choke 262 includes a circumferential downwardly extending protrusion 268. In one aspect, the purge ring 222 may be adapted to direct a purge gas toward the circumferential downwardly extending protrusion 268. In one aspect, the thickness of the downwardly extending protrusion 268 is between about 0.01 inches and about 1.0 inch, more preferably 0.01 inches and 0.5 inches.

The spacing between the choke 262 and the substrate support 212 is typically between about 0.04 inches and about 2.0 inches, and preferably between 0.04 inches and about 0.2 inches. The spacing may vary depending on the gases being delivered and the process conditions during deposition. The choke 262 helps provide a more uniform pressure distribution within the volume of a reaction zone 264 defined between the chamber lid 232 and the substrate 210 by isolating the reaction zone 264 from the non-uniform pressure distribution of the pumping zone 266 (FIG. 1).

The gas delivery system 230 further includes one or more valves (four are shown 242A, 242B, 252A, 252B) in fluid communication with separate gas sources. Each valve 242A, 242B includes a delivery line 243A, 243B having a valve seat assembly 244A, 244B and each valve 252A, 252B includes a purge line 245A, 245B having a valve seat assembly 246A, 246B. Each delivery line 243A, 243B is in communication with a respective reactant gas source 238, 239 and in communication with a respective gas inlet 236A, 236B of the expanding channel 234. The valve seat assembly 244A, 244B of the delivery line 243A, 243B controls the flow of the reactant gas from the reactant gas source 238, 239 to the expanding channel 234. The purge line 245A, 245B is in communication with the purge gas source 240 and intersects the delivery line 243A, 243B downstream of the valve seat assembly 244A, 244B of the delivery line 243A, 243B. The valve seat assembly 246A, 246B of the purge line 245A, 245B controls the flow of the purge gas from the purge gas source 240 to the delivery line 243A, 243B. If a carrier gas is used to deliver reactant gases from the reactant gas source 238, 239, preferably the same gas is used as a carrier gas and a purge gas (i.e. an argon gas used as a carrier gas and a purge gas).

Programmable logic controllers 248A, 248B may be coupled to the valves 242A, 242B to control actuation of the diaphragms of the valve seat assemblies 244A, 244B, 246A, 246B. Pneumatically actuated valves may provide pulses of gas in time periods as low as about 0.020 seconds. Electrically actuated valves may provide pulses of gas in time periods as low as about 0.005 seconds. An electrically actuated valve typically requires the use of a driver coupled between the valve and the programmable logic controller.

Each valve 242A, 242B may be a zero dead volume valve to enable flushing of a reactant gas from the delivery line 243A, 243B when the valve seat assembly 244A, 244B of the valve is closed. When the valve seat assembly 244A, 244B is closed, the purge line 245A, 245B may provide a purge gas to flush the delivery line 243A, 243B. The purge line 245A, 245B may be positioned adjacent the valve seat assembly 244A, 244B of the delivery line 243A, 243B. Alternatively, the purge line 245A, 245B is positioned slightly spaced from the valve seat assembly 244A, 244B of the delivery line 243A, 243B, as shown, so that a purge gas is not directly delivered into the valve seat assembly 244A, 244B when open. A zero dead volume valve as used herein is defined as a valve which has negligible dead volume (i.e. not necessarily zero dead volume.)

Each valve 242A, 242B may be adapted to provide a combined gas flow and/or separate gas flows of the reactant gas 238, 239 and the purge gas 240. In reference to valve 242A, one example of a combined gas flow of the reactant gas 238 and the purge gas 240 provided by valve 242A comprises a continuous flow of a purge gas from the purge gas source 240 through purge line 245A and pulses of a reactant gas from the reactant gas source 238 through delivery line 243A. The continuous flow of the purge gas may be provided by leaving the diaphragm of the valve seat assembly 246A of the purge line 245A open. The pulses of the reactant gas from the reactant gas source 238 may be provided by opening and closing the diaphragm of the valve seat 244A of the delivery line 243A. In reference to valve 242A, one example of separate gas flows of the reactant gas 238 and the purge gas 240 provided by valve 242A comprises pulses of a purge gas from the purge gas source 240 through purge line 245A and pulses of a reactant gas from the reactant gas source 238 through delivery line 243A. The pulses of the purge gas may be provided by opening and closing the diaphragm of the valve seat assembly 246A of the valve 252A. The pulses of the reactant gas from the reactant gas source 238 may be provided by opening and closing the diaphragm of the valve seat 244A of the valve 242A.

Figure 3:
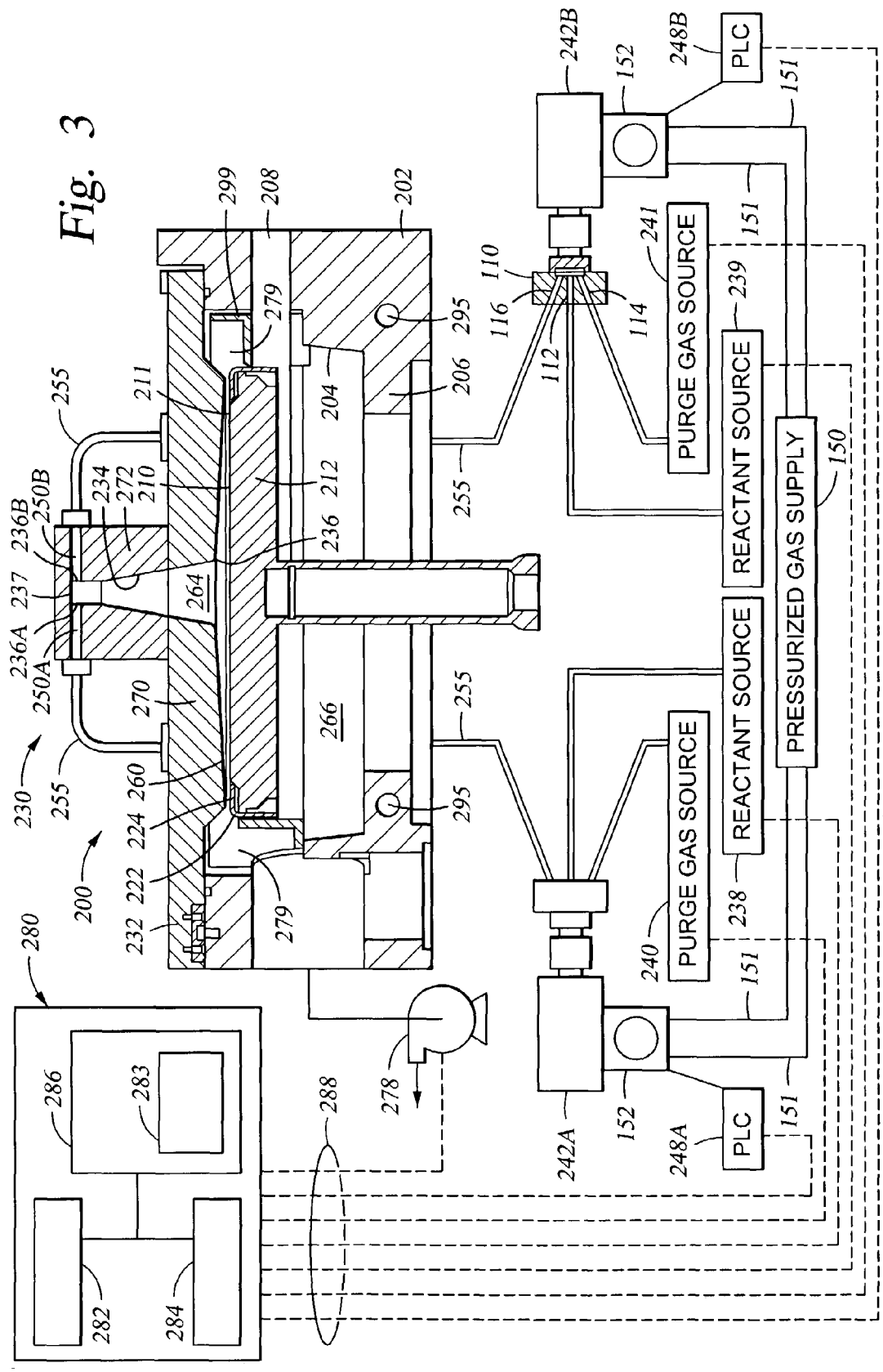
FIG. 3 is a schematic cross-sectional view of an alternative embodiment of a chamber including a gas delivery apparatus adapted for atomic layer deposition.

FIG. 3 shows an alternative embodiment of the gas delivery system 230 having the valves 242A, 242B mounted below the chamber body 202 and coupled to one or more gas lines 255 plumbed through the chamber body 202. The gas lines 255 are in turn coupled to the gas conduits 250A, 250B. The valves 242A, 242B may also be mounted in other positions and to other chamber components, such as on the chamber lid 232.

In one aspect, the valves 242A, 242B are coupled to separate reactant sources 238, 239 and separate purge gas sources 240, 241. Separate purge gas sources reduce the likelihood of cross-talk between the valves 242A, 242B. In other embodiments, valves 242A and 242B may be coupled to the same purge gas source 240, 241, as described above.

Figure 4:
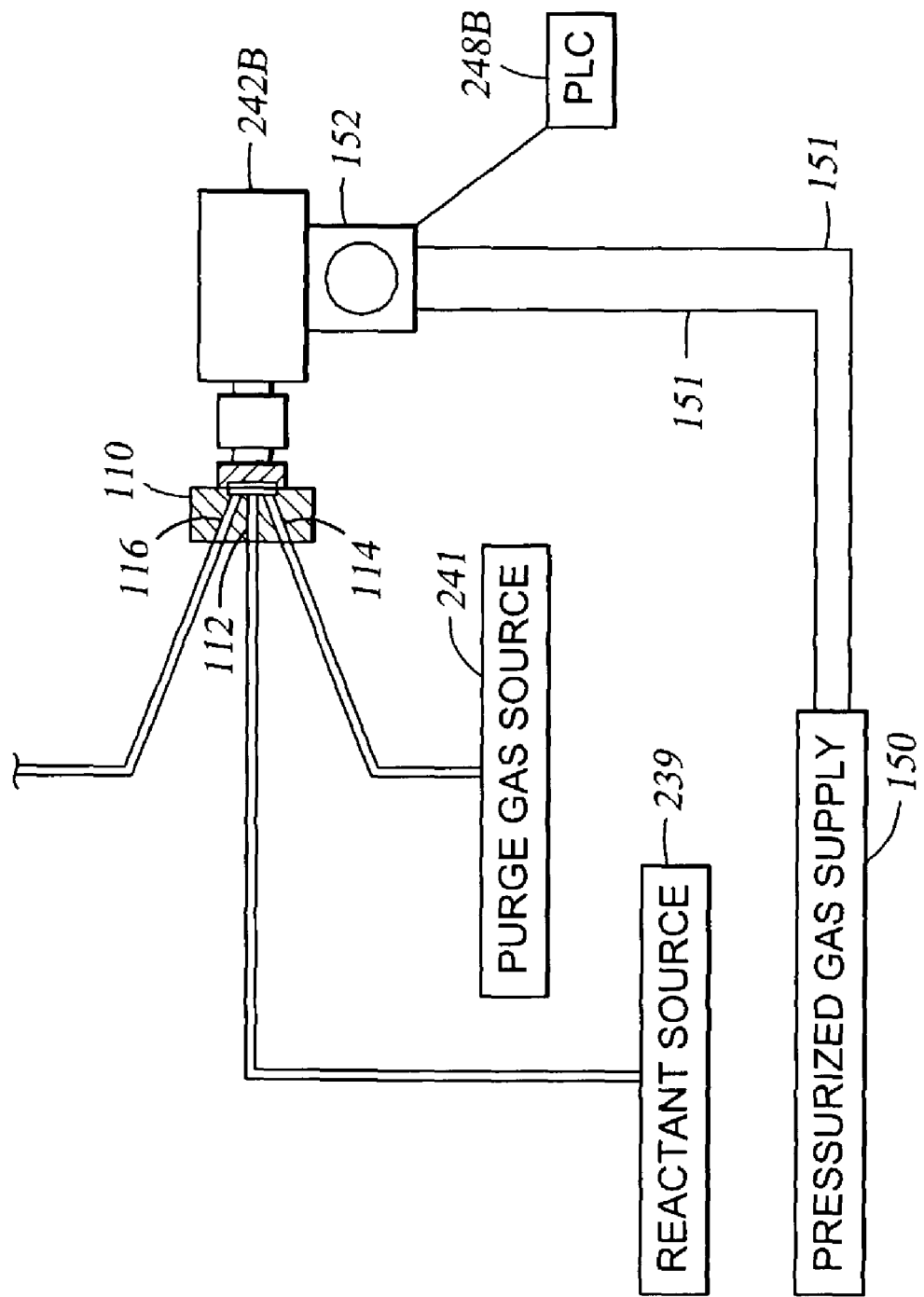
FIG. 4 is a schematic, cross-sectional view of a valve showing the valve inlets and outlets.

FIG. 4 shows a schematic, cross sectional view of the valves 242A, 242B, 252A, 252B. Each valve includes a body 110 having three ports, a reactant inlet 112, a purge inlet 114, and an outlet 116 in fluid communication. As described above, the reactant inlet 112 is in fluid communication with a reactant source 238, 239. The purge inlet 114 is in fluid communication with a purge gas source 240, 241, and the outlet 116 is in fluid communication with the processing chamber 200.

Figure 5:
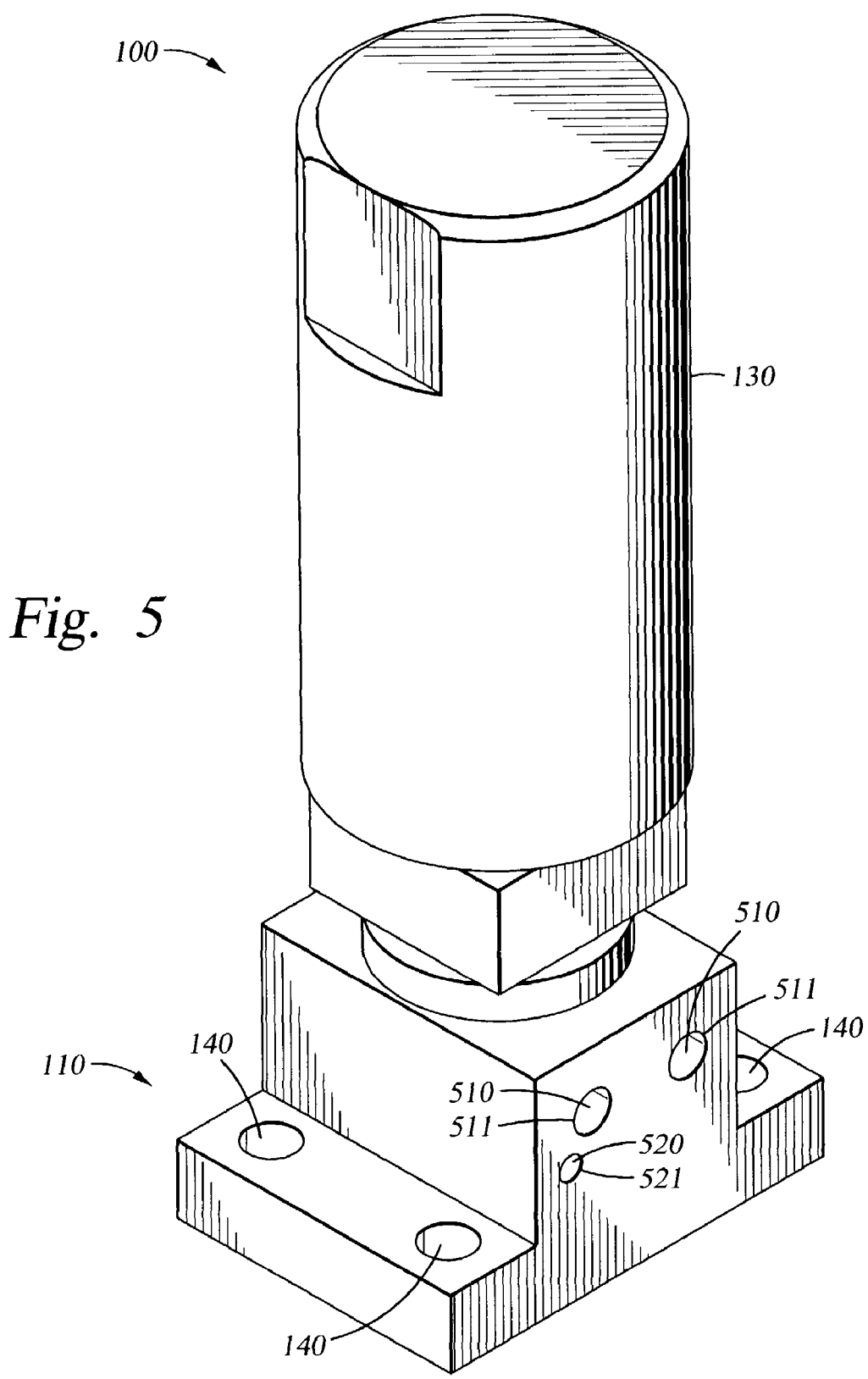
FIG. 5 is a schematic plan view of an exemplary valve shown in FIG. 4.

FIG. 5 shows a schematic perspective view of the valve shown in FIG. 4. The valve body 110 may include one or more holes 510 for insertion of an embedded heating element 511. Preferably, the holes 510 are proximate to the reactant inlet 112 (shown in FIG. 4) so that the reactant is heated to prevent condensation of the reactant within the valve 242A, 242B. The valve body 110 may also include one or more holes 520 for insertion of a thermocouple device 521 to monitor the temperature of the valve body 110. For example, a measured temperature may be used in a feedback loop to control electric current applied to the heating element 511 from a power supply, such that the valve body temperature can be maintained or controlled at a desired temperature or within a desired temperature range. The holes 510 and 520 may be positioned in close proximity, preferably at a distance of about 2.0 mm or less, to the reactant inlet 112 to better provide heating of the reactant inlet and to better monitor the temperature of the reactant inlet 112. Preferably, each hole 510 for an embedded heating element is disposed in a direction parallel to the plane of the inlets 112, 114 and the outlet 116 so that the embedded heating element may also provide a more uniform heating of the inlets 112, 114 and the outlet 116.

Figure 6:
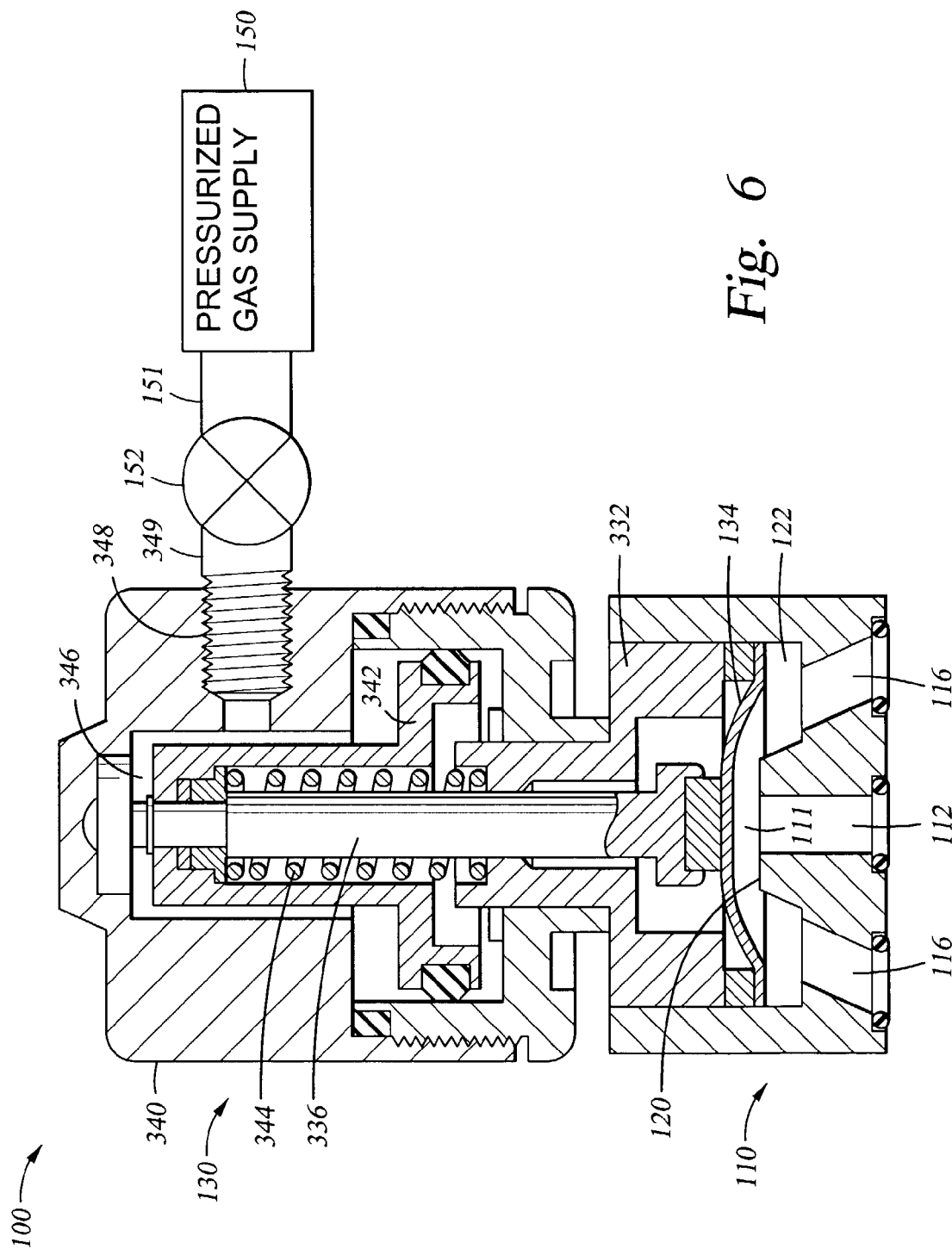
FIG. 6 is a schematic cross-sectional view of one embodiment of a valve illustrating the internal components and mechanisms of the valve.

FIG. 6 shows a diaphragm 134 is mounted over a valve seat 120, within the valve chamber 111. The diaphragm 134 is a schematic cross-sectional view of one embodiment of one of the valves 242A, 242B. However, the diaphragm is typically biased in a closed position, and is selectively moved between an open position (as shown) and a closed position. The diaphragm 134 is attached to a stem 336 which extends through, and is slidably supported by a bonnet 332. The stem 336 selectively moves the diaphragm 134 between a closed position and an open position. A cylinder 340 is fixed to the top of the bonnet 332 and houses a piston 342. The top of the stem 336 protrudes from the bonnet 332 and is attached to a lower surface of the piston 342. A spring 344 rests between the bonnet 332 and the lower surface of the piston 342 and urges the piston 342 and the stem 336 upwardly. The cylinder 340 forms an actuation chamber 346 between an upper surface of the piston 342 and the inner surface of the cylinder 340.

The diaphragm 134 may be actuated pneumatically or electronically. Preferably, the diaphragm is actuated pneumatically by controlling pressurized gas from a pressurized gas supply 150, such as air or other gas, to selectively move the diaphragm 134. Although the diaphragm 134 is pneumatically actuated, an electronically controlled valve 152, such as a solenoid valve, may be mounted or coupled to the cylinder 340 to selectively provide the pressurized gas from the pressurized gas supply 150 through a gas line 151. Although an electronically controlled valve 152 provides pressurized gas to the diaphragm assembly 130, the valves 242A, 242B are pneumatically actuated valves since the diaphragms 134 is, actuated pneumatically.

The diaphragm 134 may be biased open or closed and may be actuated closed or opened respectively. In an open position, the diaphragm 134 allows the in flow of a reactant from the reactant inlet 112 and the in flow of a purge gas from the purge inlet 114 through the valve chamber 111 to the outlet 116 and into the chamber body 202. In a closed position, the diaphragm 134 is in contact with the valve seat 120 to prevent in flow of a reactant from the reactant inlet 112 through the valve chamber 111. In certain preferred embodiments, in a closed position, the diaphragm 134 does not block the in flow of the purge gas from the purge inlet 114 through the valve chamber 111 to the outlet 116 and into the chamber body 202. The valve chamber 111 may further comprise a groove 122 formed in the valve body 110 below the valve seat 120 so that the purge inlet 114 and the outlet 116 remain in fluid communication whether the diaphragm 134 is in a closed position or open position. As shown, the groove 122 is annular in shape, but may be any suitable shape.

The valve seat 120 may be an integral piece with the valve body 110. In an alternative embodiment, the valve seat 120 may be a separate piece from the valve body 110. The valve seat 120 is preferably made of a chemically resistant material which does not react with the reactant provided through the reactant inlet 112. Examples of chemically resistant material include polyimide (PI), polytetrafluoroethylene (PTFE), polychlorotriflouroethylene (PCTFE), perfluoroalkoxy (PFA), and other suitable polymers. In less preferred embodiments, the valve seat 120 may be made of metals, metal alloys, and other suitable materials. In certain embodiments, depending on the reactant provided therethough, the valve body 110 is heated to a temperature between about 80° C. and about 90C. to prevent condensation of the reactant on the diaphragm 134 or other valve 242A, 242B components. If ammonia gas is used as a reactant, the valve seat 120 is preferably made of a chemically resistant polyimide, such as VESPEL® CR-6100. It has been shown that ammonia gas is chemically inert with the polyimide VESPEL® CR-6100 at temperatures of 80° C. or above while ammonia gas may react with other polyimides at temperatures of 80° C. or above.

Regarding the operation of the valves 242A, 242B, programmable logic controllers (PLC) 248A, 248B are coupled to the valves 242A, 242B to control electrical signals to the electronically controlled valve 152. The electronically controlled valve 152, when open, supplies pressurized gas through the connector 349 into the actuation chamber 346 creating a pressure that forces the piston 342 and the stem 336 downward against the elastic force of spring 344. The center portion of the diaphragm 134 is pressed downward by stem 336 and comes into contact with the valve seat 120 closing the inflow of reactant from the reactant inlet 112 to the outlet 116. When the diaphragm 134 is in contact with the valve seat 120, the diaphragm 134 does not block off the groove 122 and a purge gas may flow from the purge gas inlet 114 to the outlet 116. The electronically controlled valve 152, when closed, stops the supply of pressurized gas and releases the pressurized gas inside the actuation chamber 346. When the supply of pressurized gas is stopped and pressure inside the actuation chamber 346 is released, the piston 342 and the stem 336 are raised by the elastic force of the spring 344. As the piston 342 and the stem 336 rise, the diaphragm 134 moves away from the valve seat 120 of the valve body 110 allowing the inflow of reactant from the reactant inlet 112 to the outlet 116.

The diaphragm 134 is moved between an open position and a closed position to provide pulses of a reactant to the outlet 116 and into the chamber body 202. Since the diaphragm 134 in a closed position does not block off the groove 122, a continuous flow of purge gas may be provided from the purge inlet 114 through the valve chamber 111 and out to the outlet 116. As a consequence, the pulses of reactant may be dosed into the continuous flow of purge gas provided through the valve chamber 111. The continuous flow of purge gas provided through the valve chamber 111 flushes residual reactant remaining in the valve chamber 111 between pulses of reactants. In one aspect, each of the valves 242A, 242B has a zero dead volume since there is negligible dead volume between the flow path of the purge gas through the valve body 110 to the valve seat 120 of the reactant inlet 112.

Figure 7:
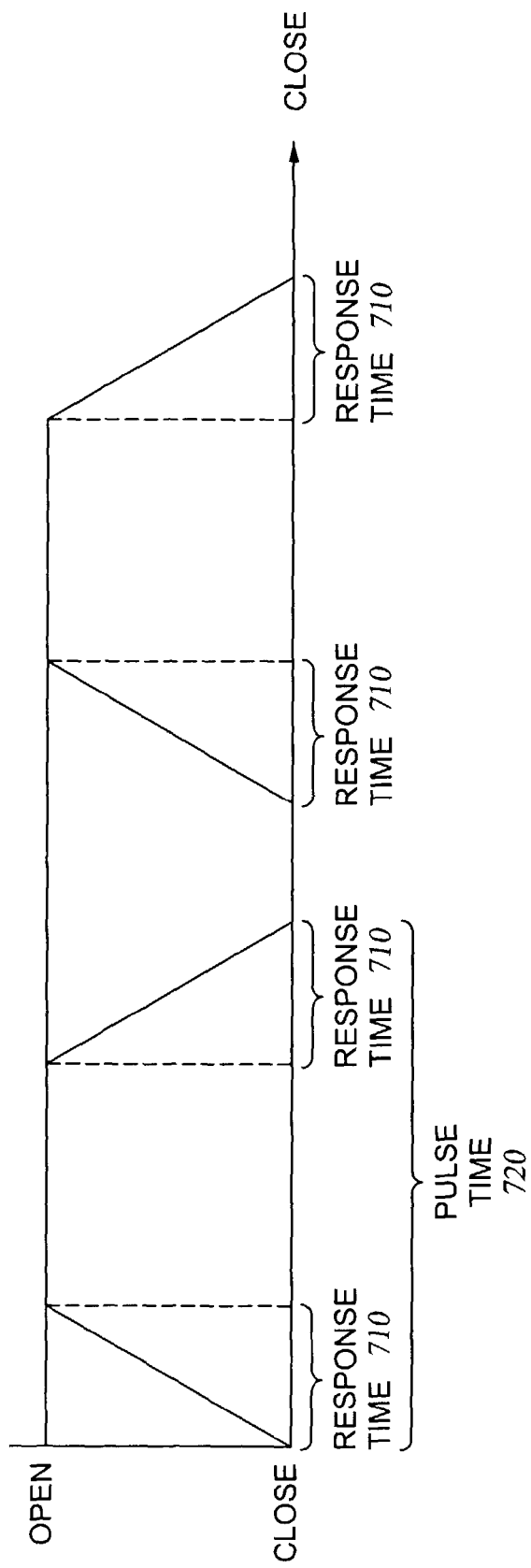
FIG. 7 is a graph of a diaphragm moved between an open position and a open position.

FIG. 7 is a graph of a diaphragm, such as a diaphragm 134 of one of the valves 242A or 242B, moved between a closed position and an open position. The term "response time" as used herein is defined as the time to move the diaphragm of a valve from an open position to a closed position or from a closed position to an open position. The response time to move the diaphragm of a valve from an open position to a closed position and the response time to move the diaphragm of a valve from a closed position to an open position may be the same or may be different, but are preferably approximately the same. Preferably, valves 242A, 242B have a response time of about 50 msec or less, more preferably 20 msec or less. It has been observed that a valve, such as valve 242A or 242B, with an internal volume of the actuation chamber of about 2.8 cm$^3$ has a response time of about 40 msec or less. It has been observed that a valve, such as valve 242A or 242B, with an internal volume of the actuation chamber of about 0.9 cm$^3$ has a response time of about 15 msec or less.

Reducing the response time of a valve assembly permits more cycles of pulses of reactants to be provided over time. Therefore, throughput of processing substrates is increased. However, the valves 242A, 242B can be operated to any desired pulse time 720. The term "pulse time" as used herein is defined as the time to move a diaphragm from a fully closed position to a fully open position and back to the fully closed position. The valves 242A, 242B may be operated to provide pulse times of about 1.0 second or less, about 500 msec or less, and even about 200 msec or less.

Pneumatic control of the diaphragm 134 provides a "soft" landing of the diaphragm 134 against the valve seat 120 in comparison to diaphragms driven up and down by a solenoid. The "soft" landing reduces the formation of particles during movement of the diaphragm between an opened position and a closed position caused by the impact of the diaphragm 134 against the valve seat 120. The "soft" landing also provides the reactant through the valve assembly 100 in more of a laminar flow in comparison to a "hard" landing caused by moving the diaphragm directly by a solenoid.

In certain embodiments, the internal volume of the actuation chamber 346 comprises a small volume, preferably about 3.0 cm$^3$ or less, more preferably about 1.0 cm$^3$ or less. The term "internal volume of the actuation chamber" as used herein refers to the inner volume of the actuation chamber when the pressure inside the actuation chamber is released and includes the inner volume of the connector 349 and any gas lines between the actuation chamber 346 and the electrically controlled valve 152. A small internal volume of the actuation chamber 346 can be pressurized more rapidly and as a consequence can actuate the diaphragm 134 more rapidly.

The electronically controlled valve 152 is mounted to the cylinder 340 of the diaphragm assembly 130 to reduce the added volume of a gas line to the internal volume of the actuation chamber. An added volume of a gas line will increase the internal volume of the actuation chamber and will, thus, increase the time required to pressurize the actuation chamber 346 and, thus, will increase the response time of the valve 242A, 242B. In alternative embodiments, if a gas line is used to couple the electronically controlled valve 152 to the cylinder 340 of the diaphragm assembly 130 the length of the gas line is preferably about 1.0 inch or less to reduce the internal volume of the actuation chamber.

The gas line 151 connecting the pressurized gas supply 150 to the electronically controlled valve 152 preferably has an inner diameter of greater than about 0.125 inches, more preferably about 0.25 inches or more. The larger inner diameter of the gas line 151 facilitates the filling of the internal volume of the actuation chamber 346 by providing a greater conductance of pressurized gas therethrough. As a consequence, a larger inner diameter of the gas line 151 supplying pressurized gas to the electronically controlled valve 152 reduces the response time of the valve assembly 242A, 242B.

Referring again to FIG. 1, the valves 242A, 242B are in fluid communication with the expanding channel 234 via gas inlets 236B, that are coupled to the delivery lines 243B. In one aspect, the gas inlets 236A, 236B are located adjacent the upper portion 237 of the expanding channel 234. In another aspect, the gas inlets 236A, 236B are located along the length of the expanding channel 234 between the upper portion 237 and the lower portion 235. The delivery lines 243A, 243B of the valves 242A, 242B may be coupled to the gas inlets 236A, 236B through gas conduits 250A, 250B. The gas conduits 250A, 250B may be integrated or may be separate from the valves 242A, 242B. In one aspect, the valves 242A, 242B are coupled in close proximity to the expanding channel 234 to reduce any unnecessary volume of the delivery line 243A, 243B and the gas conduits 250A, 250B between the valves 242A, 242B and the gas inlets 236A, 236B.

The expanding channel 234 has an inner diameter that increases from an upper portion 237 to a lower portion 235 thereof. In one specific embodiment, the inner diameter of the expanding channel 234 for a chamber adapted to process 200 mm diameter substrates is between about 0.2 inches about 1.0 inches, more preferably between about 0.3 and about 0.9 inches, and more preferably between 0.3 inches and about 0.5 at the upper portion 237 of the expanding channel 234 and between about 0.5 inches and about 3.0 inches, preferably between about 0.75 inches and about 2.5 inches, and more preferably between about 1.1 inches and about 2.0 inches at the lower portion 235 of the expanding channel 234 In another specific embodiment, the inner diameter of the expanding channel 234 for a chamber adapted to process 300 mm diameter substrates is between about 0.2 inches about 1.0 inches, more preferably between about 0.3 and about 0.9 inches, and more preferably between 0.3 inches and about 0.5 at the upper portion 237 of the expanding channel 234 and between about 0.5 inches and about 3.0 inches, preferably between about 0.75 inches and about 2.5 inches, and more preferably between about 1.2 inches and about 2.2 inches at the lower portion 235 of the expanding channel 234 for a 300 mm substrate. In general, the above dimensions apply to an expanding channel adapted to provide a total gas flow of between about 500 sccm and about 3,000 sccm. However, the dimensions may be altered to accommodate any gas flow therethough.

The expanding channel 234 may be shaped as a truncated cone (including shapes resembling a truncated cone). Whether a gas is provided toward the walls of the expanding channel 234 or directly downward towards the substrate 210, the velocity of the gas flow decreases as the gas flow travels through the expanding channel 234 due to the expansion of the gas. The reduction of the velocity of the gas flow helps reduce the likelihood of the gas blowing off reactants adsorbed on the surface of the substrate 210.

Not wishing to be bound by theory, it is believed that the diameter of the expanding channel 234, which is gradually increasing from the upper portion 237 to the lower portion 235, allows less of an adiabatic expansion of a gas flowing through the expanding channel 234 which helps to control the temperature of the gas. A sudden adiabatic expansion of a gas flowing through the expanding channel 234 may decrease the temperature of the gas resulting in condensation of the gas and formation of particles. Creating less of an adiabatic expansion of a gas, more heat may be transferred to or from the gas and thus, the temperature of the gas may be more easily controlled. The gradually expanding channel may comprise one or more tapered inner surfaces, such as a tapered straight surface, a concave surface, a convex surface, or combinations thereof or may comprise sections of one or more tapered inner surfaces (i.e. a portion tapered and a portion non-tapered).

Figure 8:
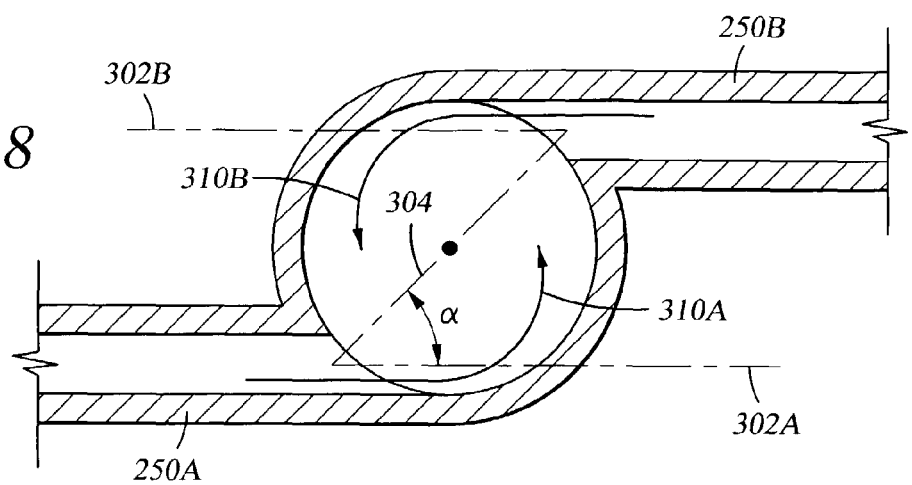
FIG. 8 is a horizontal sectional view of one embodiment of an expanding channel formed within the gas delivery apparatus of the present invention.

FIG. 8 is a top cross-sectional view of one embodiment of the expanding section 234 of the chamber lid 232. Each gas conduit 250A, 250B may be positioned at an angle a from the center line 302 of the gas conduit 250A, 250B and from a radius line 304 from the center of the expanding channel 234. Entry of a gas through the gas conduit 250A, 250B preferably positioned at an angle α (i.e., when α>0°) causes the gas to flow in a circular direction as shown by arrow 310A (or 310B). Providing gas at an angle a as opposed to directly straight-on to the walls of the expanding channel (i.e. when α=0°) helps to provide a more laminar flow through the expanding channel 234 rather than a turbulent flow. It is believed that a laminar flow through the expanding channel 234 results in an improved purging of the inner surface of the expanding channel 234 and other surfaces of the chamber lid 232. In comparison, a turbulent flow may not uniformly flow across the inner surface of the expanding channel 234 and other surfaces and may contain dead spots or stagnant spots in which there is no gas flow. In one aspect, the gas conduits 250A, 250B and the corresponding gas inlets 236A, 236B are spaced out from each other and direct a flow in the same circular direction (i.e., clockwise or counter-clockwise).

Figure 9:
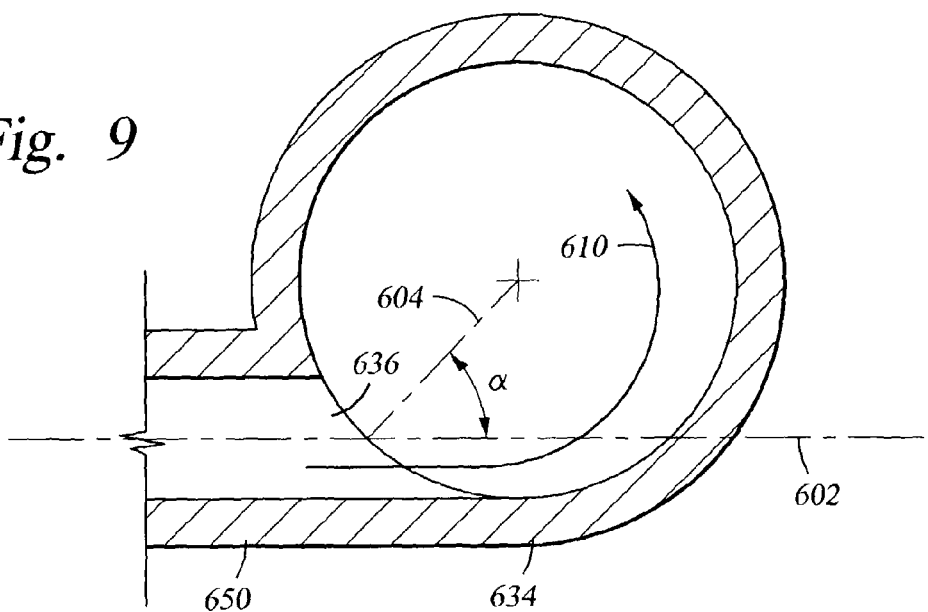
FIG. 9 is a horizontal sectional view of one embodiment of the expanding channel adapted to receive a single gas flow.

FIG. 9 is a top cross-sectional view of another embodiment of the expanding channel of the chamber lid which is adapted to receive a single gas flow through one gas inlet 636 from one gas conduit 650 coupled to a single or a plurality of valves (not shown). The gas conduit 650 may be positioned at an angle a from the center line 602 of the gas conduit 650 and from a radius line 604 from the center of the expanding channel 634. The gas conduit 650 positioned at an angle α (i.e., when α>0°) causes a gas to flow in a circular direction as shown by arrow 610.

Figure 10:
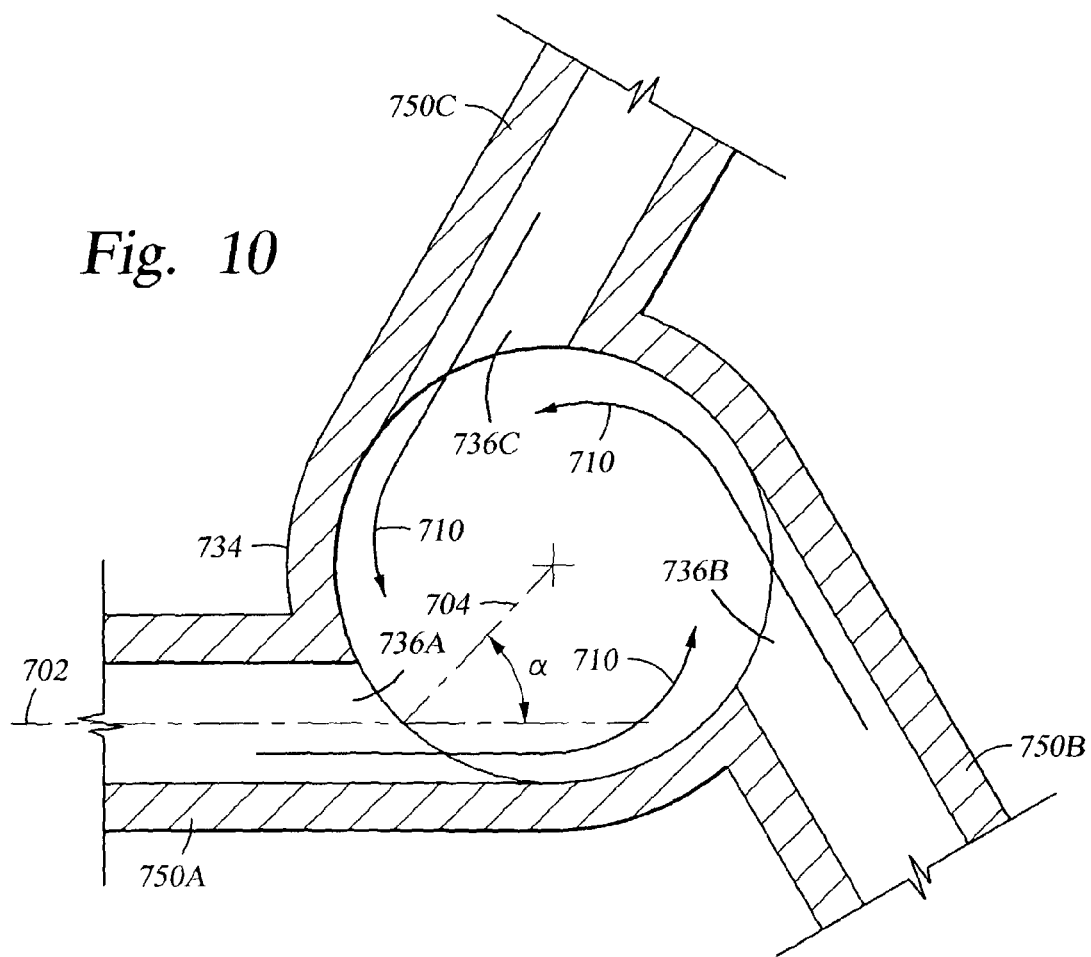
FIG. 10 is a horizontal sectional view of one embodiment of the expanding channel adapted to receive three gas flows.

FIG. 10 is a top cross-sectional view of another embodiment of the expanding channel of the chamber lid which is adapted to receive three gas flows together, partially together (i.e. two of three gas flows together), or separately through three gas inlets 736A, 736B, 736C from three gas conduits 750A, 750B, 750C in which each conduit is coupled to a single or a plurality of valves (not shown). The gas conduits 750A, 750B, 750C may be positioned at an angle a from the center line 702 of the gas conduits 750A, 750B, 750C and from a radius line 704 from the center of the expanding channel 734. The gas conduits 750A, 750B, 750C positioned at an angle a (i.e., when α>0°) causes a gas to flow in a circular direction as shown by arrow 710.

Figure 11:
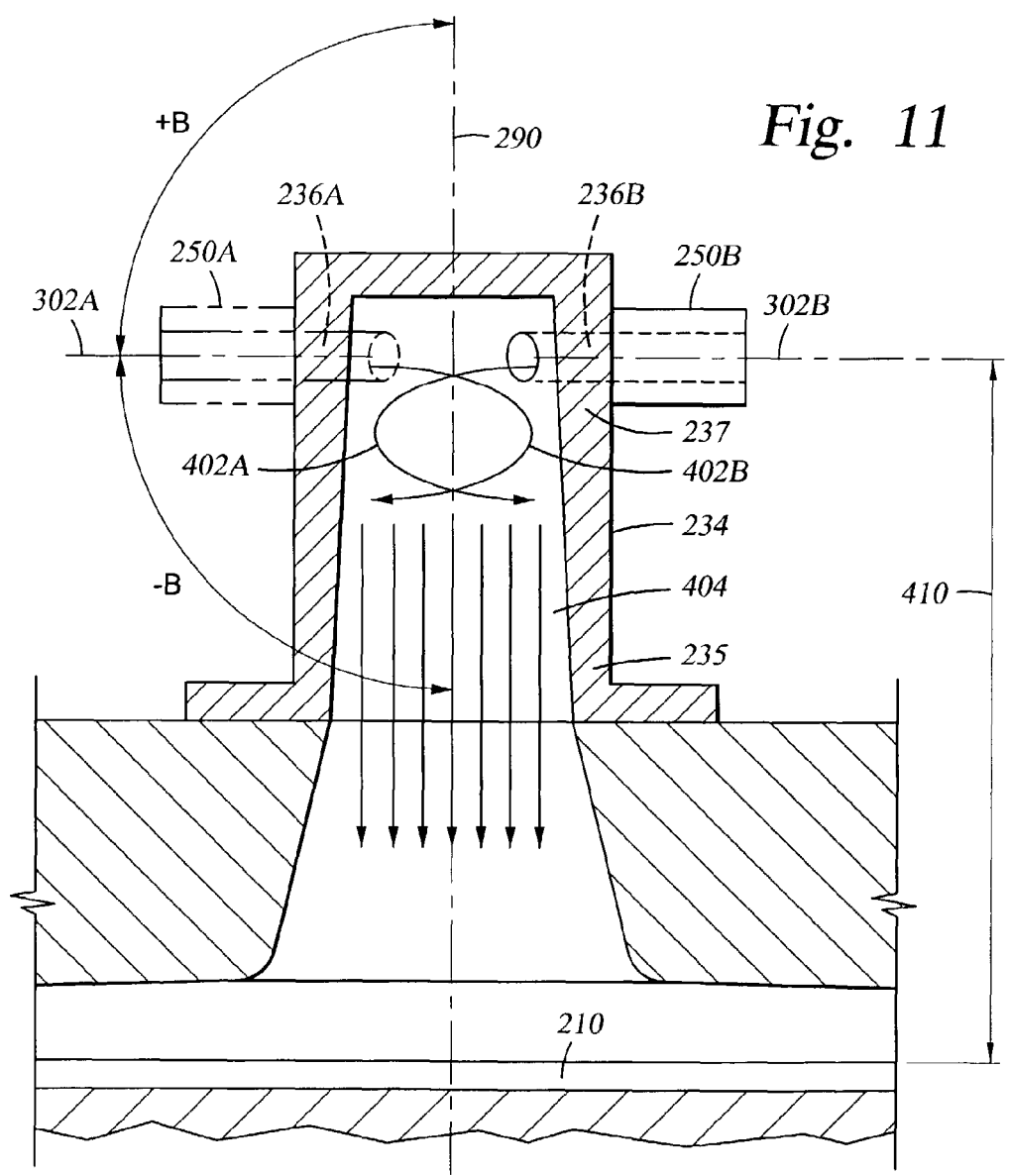
FIG. 11 is a cross-sectional view of the expanding channel formed within the gas delivery apparatus of the present invention.

FIG. 11 shows a cross-sectional view of the expanding channel 234 showing a simplified representation of two gas flows therethrough. Each gas conduit 250A, 250B and gas inlet 236A, 236B may be positioned in any relationship to a longitudinal axis 290 of the expanding channel. Each gas conduit 250A, 250B and gas inlet 236A, 236B are preferably positioned normal (in which +B, −B=to 90°) to the longitudinal axis 290 or positioned at an angle +B or an angle −B (in which 0°<+B<90° or 0°<−B<90°) from the centerline 302A, 302B of the gas conduit 250A, 250B to the longitudinal axis 290. Therefore, the gas conduit 250A, 250B may be positioned horizontally normal to the longitudinal axis 290 as shown in FIG. 3, may be angled downwardly at an angle +B, or may be angled upwardly at an angle −B to provide a gas flow toward the walls of the expanding channel 234 rather than directly downward towards the substrate 210 which helps reduce the likelihood of blowing off reactants absorbed on the surface of the substrate 210. In addition, the diameter of the gas conduits 250A, 250B may be increasing from the delivery lines 243A, 243B of the valves 242A, 242B to the gas inlet 236A, 236B to help reduce the velocity of the gas flow prior to its entry into the expanding channel 234. For example, the gas conduits 250A, 250B may comprise an inner diameter which is gradually increasing or may comprise a plurality of connected conduits having increasing inner diameters.

Although the exact flow pattern through the expanding channel 234 is not known, it is believed that the circular flow 310 may travel as a "vortex" or "spiral" flow 402A, 402B through the expanding channel 234 as shown by arrows 402A, 402B. In one aspect, the vortex flow may help to establish a more efficient purge of the expanding channel 234 due to the sweeping action of the vortex flow pattern across the inner surface of the expanding channel 234.

In one embodiment, the distance 410 between the gas inlets 236A, 236B and the substrate 210 is made far enough that the "vortex" flow 402 dissipates to a downwardly flow as shown by arrows 404 as a spiral flow across the surface of the substrate 210 may not be desirable. It is believed that the "vortex" flow 402 and the downwardly flow 404 proceeds in a laminar manner efficiently purging the chamber lid 232 and the substrate 210. In one specific embodiment the distance 410 between the upper portion 237 of the expanding channel 234 and the substrate 210 is about 1.0 inches or more, more preferably about 2.0 inches or more. In one specific embodiment, the upper limit of the distance 410 is dictated by practical limitations. For example, if the distance 410 is very long, then the residence time of a gas traveling though the expanding channel 234 would be long, then the time for a gas to deposit onto the substrate would be long, and then throughput would be low. In addition, if distance 410 is very long, manufacturing of the expanding channel 234 would be difficult. In general, the upper limit of distance 410 may be 3 inches or more for a chamber adapted to process 200 mm diameter substrates or 5 inches or more for a chamber adapted to process 300 mm diameter substrates.

Figure 12:
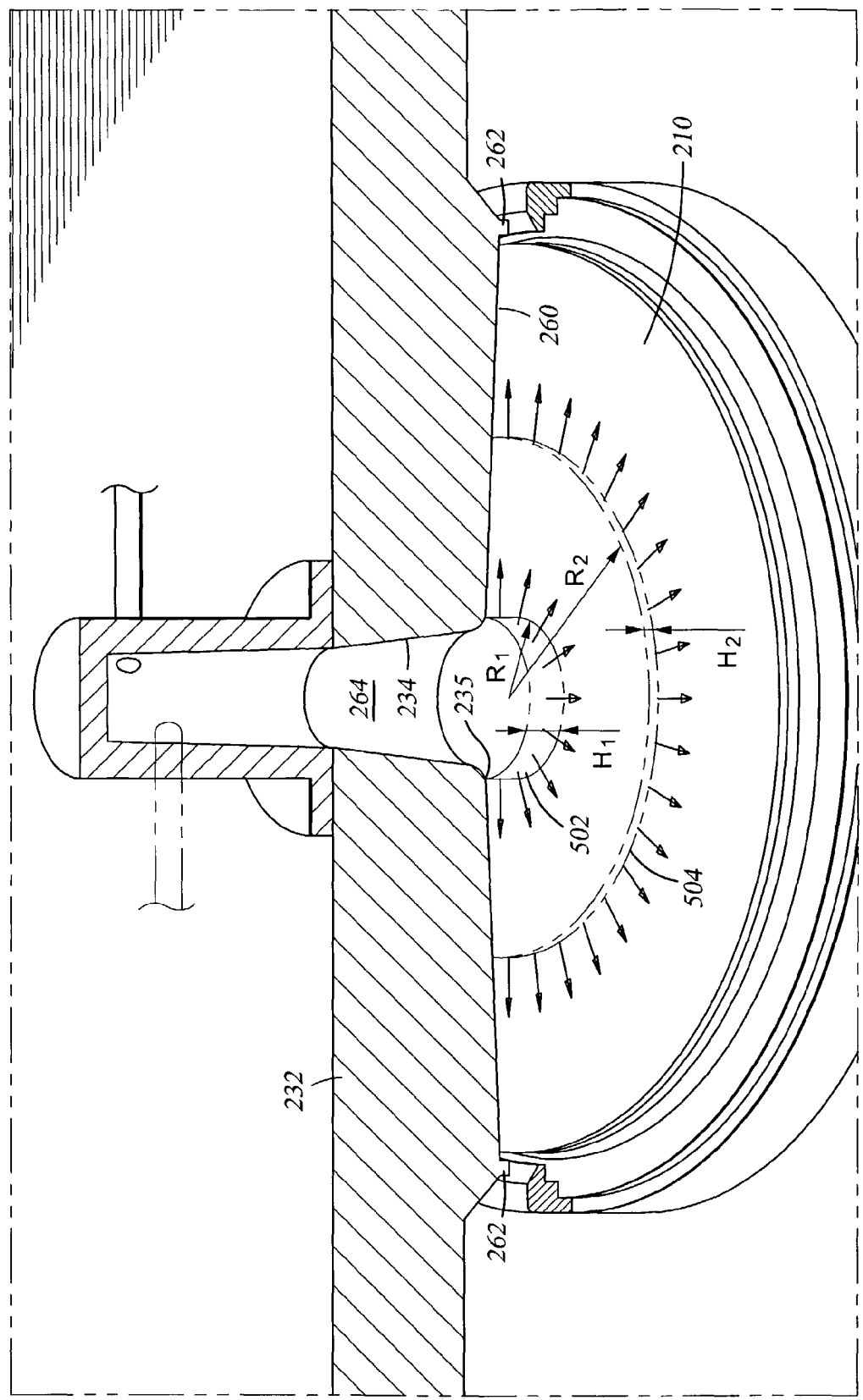
FIG. 12 is a schematic cross-sectional view illustrating the flow of a gas at two different positions between the surface of a substrate and the bottom surface of the chamber lid 1.

FIG. 12 shows a schematic view illustrating the flow of a gas at two different positions 502, 504 between the bottom surface 260 of the chamber lid 232 and the surface of a substrate 210. The velocity of the gas at any flow section, i.e. at any radius, is theoretically determined by the equation below:

$$Q/A = V \quad (1)$$

"Q" is the flow of the gas. "A" is the area of the flow section. "V" is the velocity of the gas. The velocity of the gas is inversely proportional to the area of the flow section (H×2πR), in which "H" is the height of the flow section and "2πR" is the circumference of the flow section. In other words, the velocity of a gas is inversely proportional to the height "H" of the flow section and the radius "R" of the flow section.

Comparing the velocity of the flow section at position 502 and position 504, assuming that the flow "Q" of the gas at all positions between the bottom surface 260 of the chamber lid 232 and the surface of the substrate 210 is equal, the velocity of the gas may be theoretically made equal by having the area "A" of the flow sections equal. For the area of flow sections at position 502 and position 504 to be equal, the height $H_1$ at position 502 must be greater than the height $H_2$ since $R_2 > R_1$.

In operation, a substrate 210 is delivered to the chamber 200 through the opening 208 by a robot (not shown). The substrate 210 is positioned on the substrate support 212 through cooperation of the lift pins 220 and the robot. The substrate support 212 raises the substrate 210 into close opposition to the bottom surface 260 of the chamber lid 232. A first gas flow may be injected into the expanding channel 234 of the chamber 200 by valve 242A together or separately (i.e. pulses) with a second gas flow injected into the chamber 200 by valve 242B. The first gas flow may comprise a continuous flow of a purge gas from purge gas source 240 and pulses of a reactant gas from reactant gas source 238 or may comprise pulses of a reactant gas from reactant gas source 238 and pulses of a purge gas from purge gas source 240. The second gas flow may comprises a continuous flow of a purge gas from purge gas source 240 and pulses of a reactant gas from reactant gas source 239 or may comprise pulses of a reactant gas from reactant gas source 239 and pulses of a purge gas from purge gas source 240. The gas flow travels through the expanding channel 234 as a vortex flow pattern 402 which provides a sweeping action across the inner surface of the expanding channel 234. The vortex flow pattern 402 dissipates to a downwardly flow 404 toward the surface of the substrate 210. The velocity of the gas flow reduces as it travels through the expanding channel 234. The gas flow then travels across the surface of the substrate 210 and across the bottom surface 260 of the chamber lid 232. The bottom surface 260 of the chamber lid 232, which is downwardly sloping, helps reduce the variation of the velocity of the gas flow across the surface of the substrate 210. The gas flow then travels by the choke 262 and into the pumping zone 266 of the chamber 200. Excess gas, by-products, etc. flow into the pumping channel 279 and are then exhausted from the chamber 200 by the vacuum system 278. In one aspect, the gas flow proceeds through the expanding channel 234 and between the surface of the substrate 210 and the bottom surface 260 of the chamber lid 232 in a laminar manner which aids in uniform exposure of a reactant gas to the surface of the substrate 210 and efficient purging of inner surfaces of the chamber lid 232.

Figure 13:
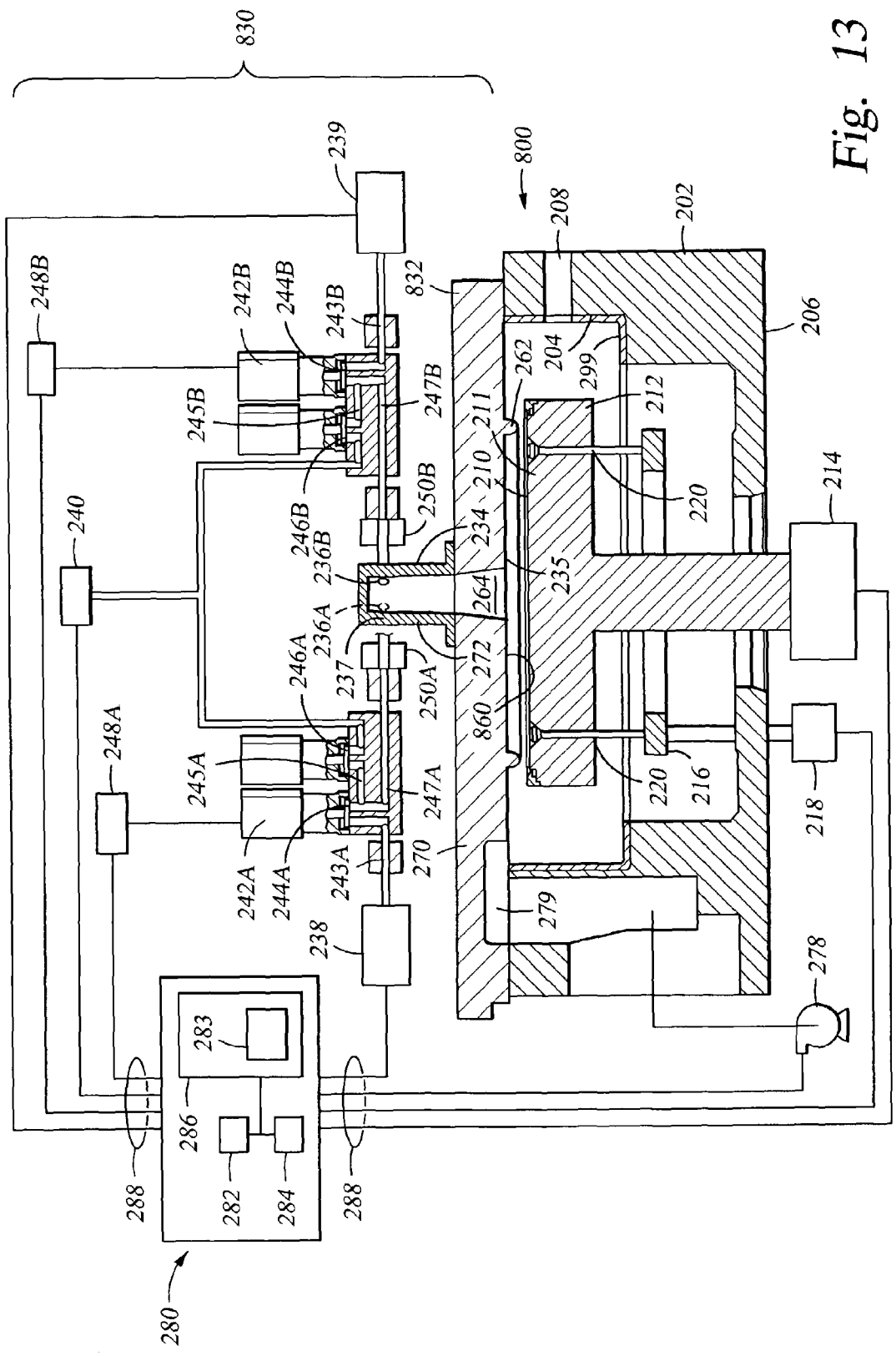
FIG. 13 is a schematic cross-sectional view of another embodiment of a chamber including a gas delivery apparatus adapted for atomic layer deposition.
Figure 14:
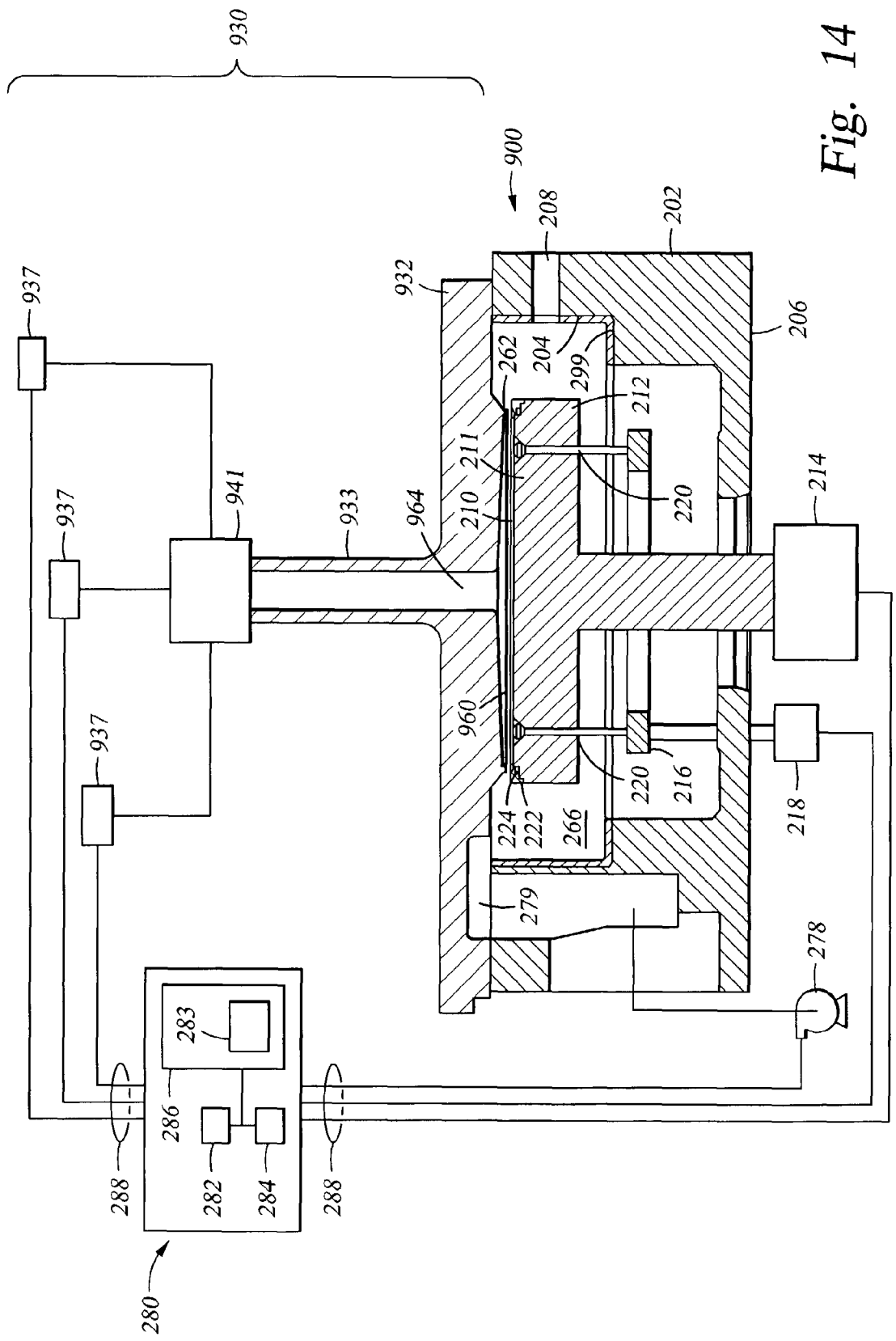
FIG. 14 shows another embodiment of a chamber including a gas delivery apparatus adapted for atomic layer deposition.

FIGS. 13 and 14 illustrate alternative embodiments of a gas delivery system capable of performing atomic layer deposition according to the present invention. Since some components are the same or similar to those described above, like numbers have been used where appropriate.

More particularly, FIG. 13 shows a chamber 800 having a gas delivery apparatus 830 comprising a chamber lid 832 that has a substantically flat bottom surface 860. In one aspect, the spacing between the choke 262 and the substrate support 210 is between about 0.04 inches and about 2.0 inches, more preferably between about 0.04 inches and about 0.2 inches.

FIG. 14 shows a chamber 900 having a gas delivery apparatus 930 comprising a chamber lid 932 that provides a reaction zone 964 having a small volume and that provides a downwardly sloping or funnel shaped bottom surface 960. Gas sources 937 are coupled to the passageway 933 through one or more valves 941. In one aspect, the passageway 933 has a long length to reduce the likelihood that a gas introduced through valve 941 will blow off reactants absorbed on the surface of the substrate 210.

Figure 15:
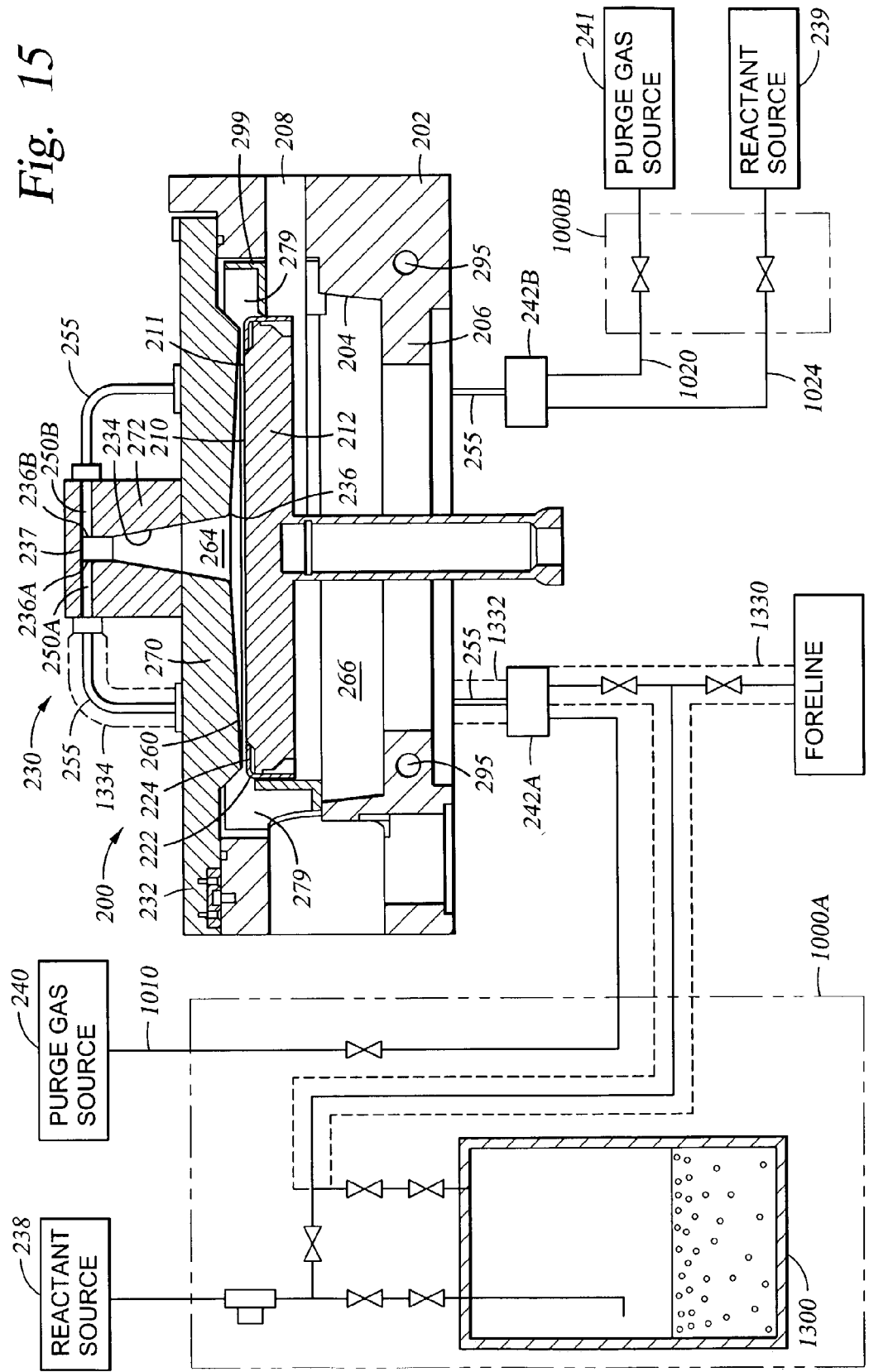
FIG. 15 is a schematic view of a gas box useful with the gas delivery apparatus of the present invention.

FIG. 15 is a schematic view of one embodiment of a gas box 1000 useful with the present invention. For clarity and ease of description, the gas box 1000 will be described with reference to the chamber 200 shown in FIG. 3. The gas box 1000 provides one or more compounds to the valves 242A, 242B. The gas box 1000 may be a single or a plurality of gas box sections (two are shown 1000A, 1000B). Each gas box section 1000A, 1000B may also include a connection 1010 to a respective purge gas source 240, 241. The gas box sections 1000A, 1000B may further include various valves for regulating or otherwise controlling the compounds provided to the valves 242A, 242B.

Figure 16:
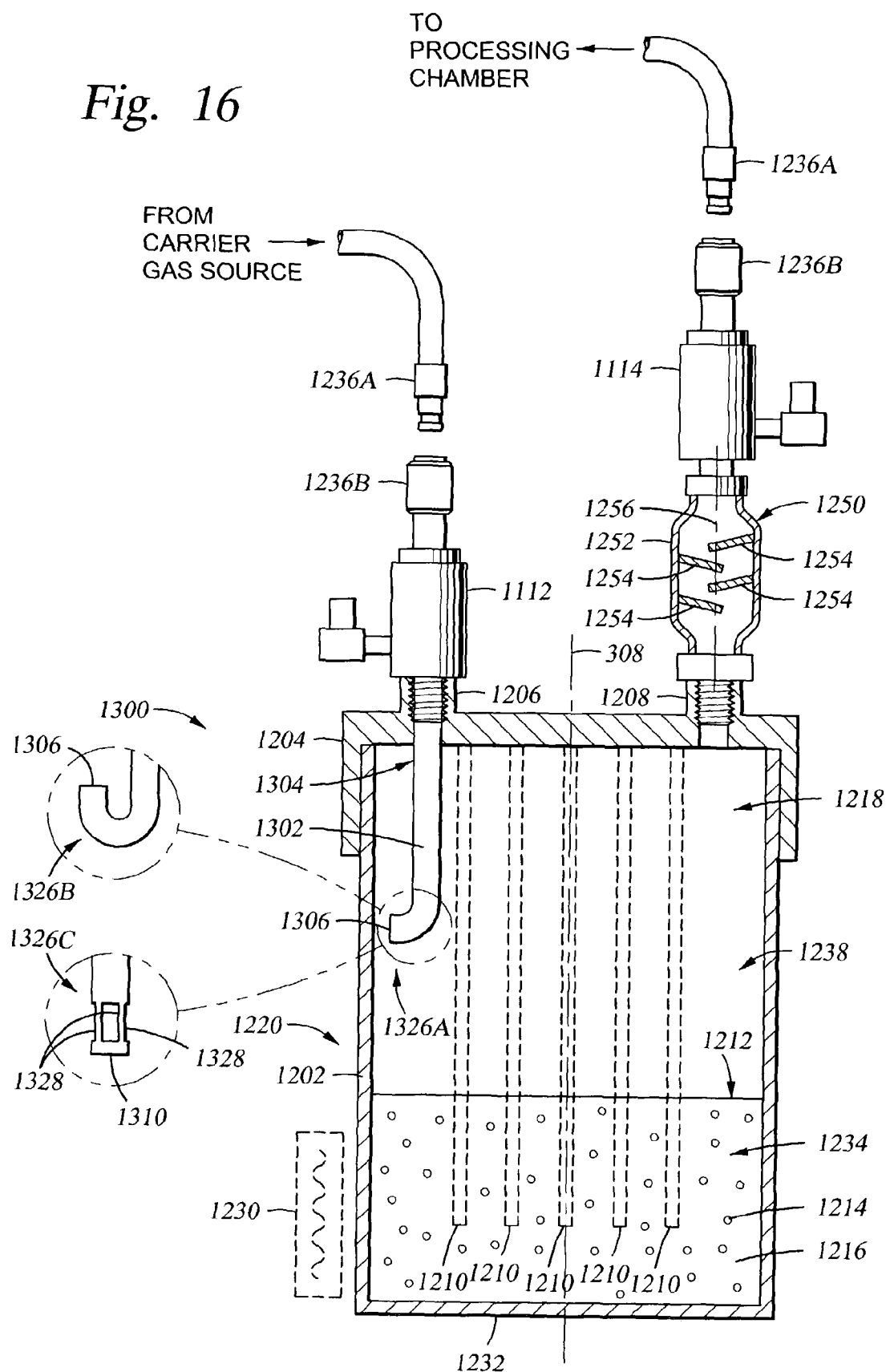
FIG. 16 is a schematic cross-sectional view of one embodiment of a canister for generating a gas via sublimation within the gas box of FIG. 15.

FIG. 16 is a schematic cross-sectional view of one embodiment of the canister 1300 for generating a gas via sublimation from a solid reactant source, such as PDMAT. The canister 1330 may be adapted to provide a gas from a liquid reactant source. In general, the canister 1330 includes a sidewall 1202, a lid 1204 and a bottom 1232 enclosing an interior volume 1238. At least one of the lid 1204 or sidewall 1202 contains an inlet port 1206 and an outlet port 1208 for gas entry and egress. Inlet and outlet ports 1206, 1208 are coupled to valves 1112, 1114 fitted with mating disconnect fittings 1236A, 1236B to facilitate removal of the canister 1300 from the gas delivery system 230. Optionally, an oil trap 1250 is coupled between the outlet port 1208 and the valve 1114 to capture any oil particulate that may be present in the gas flowing to the process chamber 200.

The interior volume 1238 of the canister 1300 is split into an upper region 1218 and a lower region 1234. Source solids 1214 at least partially fill the lower region 1234. A tube 1302 is disposed in the interior volume 1238 of the canister 1300 and is adapted to direct a flow of gas within the canister 1300 away from the source solids 1214 advantageously preventing gas flowing out of the tube 1302 from directly impinging the source solids 1214 and causing particulates to become airborne and carried through the outlet port 1208 and into the processing chamber 200.

The tube 1302 is coupled at a first end 1304 to the inlet port 1206. The tube 1302 extends from the first end 1304 to a second end 1326A that is positioned in the upper region 1218 above the source solids 1214. The second end 1326A may be adapted to direct the flow of gas toward the sidewall 1202, thus preventing direct (linear) flow of the gas through the canister 1300 between the ports 1206, 1208, creating an extended mean flow path.

In one embodiment, an outlet 1306 of the second end 1326A of the tube 1302 is positioned at an angle of about 15 to about 90 degrees relative to a center axis 1308 of the canister 1300. In another embodiment, the tube 1302 has a 'J'-shaped second end 1326B that directs the flow of gas exiting the outlet 1306 towards the lid 1204 of the canister 1300. In another embodiment, the tube 1302 has a second end 1326C having a plug or cap 1310 closing the end of the tube 1302. The second end 1326C has at least one opening 1328 formed in the side of the tube 1302 proximate the cap 1310. Gas, exiting the openings 1328, is typically directed perpendicular to the center axis 1308 and away from the source solids 1214 disposed in the lower region 1234 of the canister 1300. Optionally, an at least one baffle 1210 (shown in phantom) as described above may be disposed within the chamber 1300 and utilized in tandem with any of the embodiments of the tube 1302 described above.

In operation, the lower region 1234 of the canister 1300 is at least partially filled with a source solid 1214. Alternatively, a liquid 1216 may be added to the source solid 1214 to form a slurry 1212. The canister 1300 is held at a desired pressure and is heated to a desired temperature by a resistive heater 1230 located proximate to the canister 1300. A carrier gas, such as argon gas, is flowed through the inlet port 1206 and the tube 1302 into the upper region 1218 at a desired rate. The second end 1326A of the tube 1302 directs the flow of the carrier gas in an extended mean flow path away from the outlet port 1208, advantageously increasing the mean dwell time of the carrier gas in the upper region 1218 of the canister 1300 and preventing direct flow of carrier gas upon the source solids 1214 to minimize particulate generation. The increased dwell time in the canister 1300 advantageously increases the saturation level of vapors of the sublimated solid within the carrier gas while the decrease in particulate generation improves product yields, conserves source solids, and reduces downstream contamination.

Referring to FIG. 15, the temperature of various components of the chamber 200 and the gas box 1000 may be controlled to reduce unwanted particle formation in the chamber. For example, controlling the temperature may prevent gas decomposition, deposition, or condensation on various components of the chamber 200 and the gas box 1000. For example, it may be desirable that the flow paths of the reactants from the reactant source to the gas distribution system 230 are at a relatively high temperature to prevent condensation (i.e. vapor to solid or vapor to liquid) of the reactants in the flow path. It may be desirable that the chamber body 202 and the chamber lid 232 are at a relatively low temperature to prevent deposition of the reactants on the surfaces of the chamber body and the chamber lid.

In one embodiment, the canister 1300 is maintained at a temperature between about 60° C. to about 70° C. The gas lines (denoted by area 1330) from the canister 1300 to the valve 242A and from the canister 1300 to the foreline are maintained, such as by heater tape or other heating device, at a temperature between about 80° C. and about 90° C. The valve 242A is maintained at a temperature between about 80° C. and about 90° C. The gas line 255 (denoted by area 1332) from the valve 242A to the chamber body 202 is maintained, such as by heater tape or other heating device, at a temperature between about 85° C. and about 95° C. Preferably, there is a slight increasing temperature gradient of the flow path of the reactant from the canister 1300 to the chamber body 202 so that any condensation of the reactant will flow toward the canister rather than toward the chamber body 202. In addition, the purge gas source 240 preferably provides a pre-heated purge gas, such as argon gas, at a temperature between about 85° C. and about 95° C. The pre-heated purge gas helps reduce the likelihood of particle formation at area 1332 due the expansion of gases at area 1332 due to the increased volume at area 1332.

Then, gas line 255 (denoted by area 1334) from the chamber plate portion 270 to the cap 272 is maintained, such as by a cartridge heater or heater tape, at a temperature between about 45° C. and about 55° C. In other embodiments, area 1334 is not directly heated (i.e. there is no heating device directly controlling the temperature of area 1334).

In one embodiment, the gas lines from the purge gas source and the nitrogen containing source to the valve 242B are not heated. Valve 242B is not heated. The gas line 255 from the valve 242B to the chamber body 202 and the gas line 255 from the chamber plate portion 270 to the cap 272 are also not heated.

In one embodiment, the chamber sidewalls 204 are maintained at a temperature between about 20° C. and about 25° C. The chamber plate portion 270 is maintained at a temperature between about 25° C. and about 35° C. The cap 272 is maintained at a temperature between about 30° C. and about 40° C. The chamber sidewall 202 may be maintained at a desired temperature by forming channels 295 (FIG. 1) therethrough and providing a temperature control fluid, such as a cooling fluid or heating fluid, through the channels.

In one embodiment, the chamber plate portion 270 and the cap 272 do not include heating or cooling elements. Cooling of the chamber plate portion 270 and the cap 272 are provided by heat transfer from the chamber plate portion 270 and the cap 272 to the chamber sidewalls 204. In other embodiments, the chamber plate portion 270 and the cap 272 may include cooling elements and/or heating elements. In one embodiment, the gas lines 255 plumbed through the chamber body 202 do not contact the chamber body 202 and/or are separated from the chamber body 202 by an insulator which minimizes the heat transfer between the gas lines 255 and the chamber body 202.

In certain embodiments, the valves 242A, 242B are mounted apart or away from the chamber lid 232, such as below the chamber body 202 as shown in FIG. 3, to simplify control of the temperature of the chamber lid 232. For example, a heated valve mounted to or in close proximity to the chamber lid 232 may transfer heat to the chamber lid 232. Heat transferred to the chamber lid 232 may cause or increase unwanted deposition of gases on the interior surfaces thereof, such as on the expanding channel 234 and the bottom surface 260. The valves 242A, 242B mounted away from the lid do not significantly increase the volume of reaction zone 264 because there is little or no backstreaming of gases into the gas conduits 250A, 250B. For example, with a continuous flow of a purge provided by the valves 242A, 242B with reactants dosed into the purge gas stream, there is a substantially constant forward flow of gases provided through the gas conduits 250A, 250B into the chamber body 202.

The control unit 280, such as a programmed personal computer, work station computer, or the like, may be coupled to the chamber 200 to control processing conditions, as shown in FIG. 1. For example, the control unit 280 may be configured to control flow of various process gases and purge gases from gas sources 238, 239, 240 through the valves 242A, 242B during different stages of a substrate process sequence. The control unit 280 may include a central processing unit (CPU) 282, support circuitry 284, and memory 286 containing associated control software 283.

The control unit 280 may be one of any form of general purpose computer processor that can be used in an industrial setting for controlling various chambers and sub-processors. The CPU 282 may use any suitable memory 286, such as random access memory, read only memory, floppy disk drive, hard disk, or any other form of digital storage, local or remote. Various support circuits may be coupled to the CPU 282 for supporting the chamber 200. The control unit 280 may be coupled to another controller that is located adjacent individual chamber components, such as the programmable logic controllers 248A, 248B of the valves 242A, 242B. Bi-directional communications between the control unit 280 and various other components of the chamber 200 are handled through numerous signal cables collectively referred to as signal buses 288, some of which are illustrated in FIG. 1. In addition to control of process gases and purge gases from gas sources 238, 239, 240 and from the programmable logic controllers 248A, 248B of the valves 242A, 242B, the control unit 280 may be configured to be responsible for automated control of other activities used in wafer processing, such as wafer transport, temperature control, chamber evacuation, among other activities, some of which are described elsewhere herein.

The processing chamber 200 and the gas delivery apparatus 230, described above may be used to advantage to implement cyclical deposition of elements, which include but are not limited to, tantalum, titanium, tungsten, and copper, or to implement cyclical deposition of compounds or alloys/combination films, which include but are not limited to tantalum nitride, tantalum silicon nitride, titanium nitride, titanium silicon nitride, tungsten nitride, tungsten silicon nitride, and copper aluminum on a substrate surface. The processing chamber 200 and the gas delivery apparatus 230, as described above, may also be used to advantage to implement chemical vapor deposition of various materials on a substrate surface.

A "substrate surface", as used herein, refers to any substrate surface upon which film processing is performed. For example, a substrate surface may include silicon, silicon oxide, doped silicon, germanium, gallium arsenide, glass, sapphire, and any other materials such as metals, metal nitrides, metal alloys, and other conductive materials, depending on the application. A substrate surface may also include dielectric materials such as silicon dioxide and carbon doped silicon oxides.

"Cyclical deposition" as used herein refers to the sequential introduction of two or more reactive compounds to deposit a mono layer of material on a substrate surface. The two or more reactive compounds are alternatively introduced into a reaction zone of a processing chamber. Each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. When a ternary material is desired, such as titanium silicon nitride, for example, a third compound (C), is dosed/pulsed into the reaction zone followed by a third time delay. During each time delay an inert gas, such as argon, is introduced into the processing chamber to purge the reaction zone or otherwise remove any residual reactive compound from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface.

A "pulse" or "dose" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, and the volatility/reactivity of the particular compound itself.

The durations for each pulse/dose are variable and may be adjusted to accommodate, for example, the volume capacity of the processing chamber as well as the capabilities of a vacuum system coupled thereto. Additionally, the dose time of a compound may vary according to the flow rate of the compound, the pressure of the compound, the temperature of the compound, the type of dosing valve, the type of control system employed, as well as the ability of the compound to adsorb onto the substrate surface. Dose times may also vary based upon the type of layer being formed and the geometry of the device. In general, a dose time should be long enough to provide a volume of compound sufficient to adsorb/chemisorb onto substantially the entire surface of the substrate and form a layer of the desired thickness of the compound thereon.

The term "compound" is intended to include one or more precursors, oxidants, reductants, reactants, and catalysts, or a combination thereof. The term "compound" is also intended to include a grouping of compounds, such as when two or more compounds are introduced in a processing system at the same time. For example, a grouping of compounds may include one or more catalysts and one or more precursors. The term "compound" is further intended to include one or more precursors, oxidants, reductants, reactants, and catalysts, or a combination thereof in an activated or otherwise energized state, such as by disassociation or ionization.

It is believed that the surface attraction used to physisorb, adsorb, absorb, or chemisorb a monolayer of reactants on a substrate surface are self-limiting in that only one monolayer may be deposited onto the substrate surface during a given pulse because the substrate surface has a finite number of sites available for the reactants. Once the finite number of sites is occupied by the reactants, further deposition of the reactants will be blocked. The cycle may be repeated to a desired thickness of the tantalum nitride layer.

For clarity and ease of description, the method will be further described as it relates to the deposition of a tantalum nitride (TaN) barrier layer using a cyclical deposition technique. Pulses of a tantalum containing compound, such as pentadimethylamino-tantalum (PDMAT; $Ta(NMe_2)_5$), may be introduced by gas source 238 through valve 242A. The tantalum containing compound may be provided with the aid of a carrier gas, which includes, but is not limited to, helium (He), argon (Ar), nitrogen ($N_2$), hydrogen ($H_2$), and combinations thereof. Pulses of a nitrogen containing compound, such as ammonia, may be introduced by gas source 239 through valve 242A. A carrier gas may also be used to help deliver the nitrogen containing compound. A purge gas, such as argon, may be introduced by gas source 240 through valve 242A and/or through valve 242B. In one aspect, the flow of purge gas may be continuously provided by gas sources 240 through valves 242A, 242B to act as a purge gas between the pulses of the tantalum containing compound and of the nitrogen containing compound and to act as a carrier gas during the pulses of the tantalum containing compound and the nitrogen containing compound. In one aspect, delivering a purge gas through two gas conduits 250A, 250B provides a more complete purge of the reaction zone 264 rather than a purge gas provided through one gas conduit 250A, 250B. In one aspect, a reactant gas may be delivered through one gas conduit 250A, 250B since uniformity of flow of a reactant gas, such as a tantalum containing compound or a nitrogen containing compound, is not as critical as uniformity of the purge gas due to the self-limiting absorption process of the reactants on the surface of substrate structures. In other embodiments, a purge gas may be provided in pulses. In other embodiments, a purge gas may be provided in more or less than two gas flows. In other embodiments, a tantalum containing gas may be provided in more than a single gas flow (i.e. two or more gas flows). In other embodiments, a nitrogen containing may be provided in more than a single gas flow (i.e. two or more gas flows).

Other examples of tantalum containing compounds, include, but are not limited to, other organo-metallic precursors or derivatives thereof, such as pentaethylmethylamino-tantalum (PEMAT; $Ta[N(C_2H_5CH_3)_2]_5$), pentadiethylamino-tantalum (PDEAT; $Ta(NEt_2)_5$,), and any and all derivatives of PEMAT, PDEAT, or PDMAT. Other tantalum containing compounds include without limitation TBTDET ($Ta(NEt_2)_3 NC_4H_9$ or $C_{16}H_{39}N_4Ta$) and tantalum halides, for example $TaX_5$ where X is fluorine (F), bromine (Br) or chlorine (Cl), and/or derivatives thereof. Other nitrogen containing compounds may be used which include, but are not limited to, $N_xH_y$, with x and y being integers (e.g., hydrazine ($N_2H_4$)), dimethyl hydrazine (($CH_3)_2N2H2$), t-butylhydrazine ($C_4H_9N_2H_3$) phenylhydrazine ($C_6H_5N_2H_3$), other hydrazine derivatives, a nitrogen plasma source (e.g., $N_2$, $N_2/H_2$, $NH_3$, or a $N_2H_4$ plasma), 2,2'-azoisobutane (($CH_3)_6C_2N_2$), ethylazide ($C_2H_5N_3$), and other suitable gases. Other examples of purge gases include, but are not limited to, helium (He), nitrogen ($N_2$), hydrogen ($H_2$), other gases, and combinations thereof.

The tantalum nitride layer formation is described as starting with the adsorption of a monolayer of a tantalum containing compound on the substrate followed by a monolayer of a nitrogen containing compound. Alternatively, the tantalum nitride layer formation may start with the adsorption of a monolayer of a nitrogen containing compound on the substrate followed by a monolayer of the tantalum containing compound. Furthermore, in other embodiments, a pump evacuation alone between pulses of reactant gases may be used to prevent mixing of the reactant gases.

The time duration for each pulse of the tantalum containing compound, the time duration for each pulse of the nitrogen containing compound, and the duration of the purge gas between pulses of the reactants are variable and depend on the volume capacity of a deposition chamber employed as well as a vacuum system coupled thereto. For example, (1) a lower chamber pressure of a gas will require a longer pulse time; (2) a lower gas flow rate will require a longer time for chamber pressure to rise and stabilize requiring a longer pulse time; and (3) a large-volume chamber will take longer to fill, longer for chamber pressure to stabilize thus requiring a longer pulse time. Similarly, time between each pulse is also variable and depends on volume capacity of the process chamber as well as the vacuum system coupled thereto. In general, the time duration of a pulse of the tantalum containing compound or the nitrogen containing compound should be long enough for adsorption of a monolayer of the compound. In one aspect, a pulse of a tantalum containing compound may still be in the chamber when a pulse of a nitrogen containing compound enters. In general, the duration of the purge gas and/or pump evacuation should be long enough to prevent the pulses of the tantalum containing compound and the nitrogen containing compound from mixing together in the reaction zone.

Generally, a pulse time of about 1.0 second or less for a tantalum containing compound and a pulse time of about 1.0 second or less for a nitrogen containing compound are typically sufficient to absorb alternating monolayers on a substrate structure. A time of about 1.0 second or less between pulses of the tantalum containing compound and the nitrogen containing compound is typically sufficient for the purge gas, whether a continuous purge gas or a pulse of a purge gas, to prevent the pulses of the tantalum containing compound and the nitrogen containing compound from mixing together in the reaction zone. Of course, a longer pulse time of the reactants may be used to ensure absorption of the tantalum containing compound and the nitrogen containing compound and a longer time between pulses of the reactants may be used to ensure removal of the reaction by-products.

During deposition, the substrate 210 may be maintained approximately below a thermal decomposition temperature of a selected tantalum containing compound. An exemplary heater temperature range to be used with tantalum containing compounds identified herein is approximately between about 20° C. and about 500° C. at a chamber pressure less than about 100 torr, preferably less than 50 torr. When the tantalum containing gas is PDMAT, the heater temperature is preferably between about 100° C. and about 300° C., more preferably between about 175° C. and 250° C., and the chamber pressure is between about 1.0 and about 5.0 torr. In other embodiments, it should be understood that other temperatures and pressures may be used. For example, a temperature above a thermal decomposition temperature may be used. However, the temperature should be selected so that more than 50 percent of the deposition activity is by absorption processes. In another example, a temperature above a thermal decomposition temperature may be used in which the amount of decomposition during each precursor deposition is limited so that the growth mode will be similar to an atomic layer deposition growth mode.

An exemplary process of depositing a tantalum nitride layer by cyclical deposition, comprises providing pulses of pentadimethylamino-tantalum (PDMAT) from gas source 238 at a flow rate between about 100 sccm and about 1000 sccm, preferably between about 100 sccm and about 400 sccm, through valve 242A for a pulse time of about 0.5 seconds or less, about 0.1 seconds or less, or about 0.05 seconds or less due the smaller volume of the reaction zone 264. Pulses of ammonia may be provided from gas source 239 at a flow rate between about 100 sccm and about 1000 sccm, preferably between 200 sccm and about 600 sccm, through valve 242B for a pulse time of about 0.5 seconds or less, about 0.1 seconds or less, or about 0.05 seconds or less due to a smaller volume of the reaction zone 264. An argon purge gas at a flow rate between about 100 sccm and about 1000 sccm, preferably, between about 100 sccm and about 400 sccm, may be continuously provided from gas source 240 through valves 242A, 242B. The time between pulses of the tantalum containing compound and the nitrogen containing compound may be about 0.5 seconds or less, about 0.1 seconds or less, or about 0.07 seconds or less due to the smaller volume of the reaction zone 264. It is believed that a pulse time of about 0.016 seconds or more is required to fill the reaction zone 264 with a reactant gas and/or a purge gas. The heater temperature preferably is maintained between about 100° C. and about 300° C. at a chamber pressure between about 1.0 and about 5.0 torr. This process provides a tantalum nitride layer in a thickness between about 0.5 Å and about 1.0 Å per cycle. The alternating sequence may be repeated until a desired thickness is achieved.

In one embodiment, the layer, such as a tantalum nitride layer, is deposited to a sidewall coverage of about 50 Å or less. In another embodiment, the layer is deposited to a sidewall coverage of about 20 Å or less. In still another embodiment, the layer is deposited to a sidewall coverage of about 10 Å or less. A tantalum nitride layer with a thickness of about 10 Å or less is believed to be a sufficient thickness in the application as a barrier layer to prevent copper diffusion. In one aspect, a thin barrier layer may be used to advantage in filling submicron (e.g., less than 0.15 µm) and smaller features having high aspect ratios (e.g., greater than 5 to 1). Of course, a layer having a sidewall coverage of greater than 50 Å may be used.

Embodiments of cyclical deposition have been described above as absorption of a monolayer of reactants on a substrate. The present invention also includes embodiments in which the reactants are deposited to more or less than a monolayer. The present invention also includes embodiments in which the reactants are not deposited in a self-limiting manner. The present invention also includes embodiments in which deposition occurs in mainly a chemical vapor deposition process in which the reactants are delivered sequentially or simultaneously.

Embodiments of cyclical deposition have been described above as the deposition of a binary compound of tantalum nitride utilizing pulses of two reactants. In the deposition of other elements or compounds, pulses of two or more reactants may also be used.

While foregoing is directed to the preferred embodiment of the present invention, other and further embodiments of the invention may be devised without departing from the basic scope thereof, and the scope thereof is determined by the claims that follow.

The invention claimed is:

1. A chamber, comprising:
a chamber body;
a substrate support at least partially disposed within the chamber body and having a substrate receiving surface;
a chamber lid comprising an expanding channel extending downwardly from a central portion of the chamber lid and a tapered bottom surface extending radially from the expanding channel to a peripheral portion of the chamber lid, wherein the tapered bottom surface and the expanding channel share a co-linear symmetry axis, and wherein the tapered bottom surface is shaped and sized to substantially cover the substrate receiving surface;
one or more valves in fluid communication with the expanding channel; and
one or more gas sources in fluid communication with each valve.

2. The chamber of claim 1, further comprising one or more gas conduits fluidly connecting the one or more valves and the expanding channel and disposed normal to a longitudinal axis of the expanding channel.

3. The chamber of claim 2, wherein the one or more gas conduits are disposed at an angle to the longitudinal axis of the expanding channel.

4. The chamber of claim 1, wherein the tapered bottom surface comprises a surface selected from the group consisting of a straight surface, a concave surface, a convex surface, or combinations thereof.

5. The chamber of claim 1, wherein the expanding channel is shaped as a truncated cone.

6. The chamber of claim 1, wherein the expanding channel comprises an upper portion and a lower portion, the upper portion having a smaller inner diameter than the lower portion.

7. The chamber of claim 1, wherein a common gas source is coupled to each valve and wherein separate gas sources are coupled to each valve.

8. The chamber of claim 1, further comprising a choke disposed on the chamber lid adjacent a perimeter of the bottom surface.

9. A chamber, comprising:
a substrate support having a substrate receiving surface;
a chamber lid comprising an expanding channel extending from a central longitudinal axis of the chamber lid and comprising a tapered bottom surface extending radially from the expanding channel to a peripheral portion of the chamber lid;
one or more gas conduits connected to an upper portion of the expanding channel, wherein the one or more gas conduits are connected at an angle normal to the expanding channel from a center of the expanding channel;
one or more valves disposed below the expanding channel and coupled to the expanding channel via the one or more gas conduits; and
a choke disposed on the chamber lid adjacent a perimeter of the tapered bottom surface.

10. The chamber of claim 9, wherein the one or more gas conduits are connected at an angle to the longitudinal axis of the expanding channel.

11. A gas delivery assembly, comprising:
a chamber lid comprising an expanding channel extending downwardly from a central portion of the chamber lid and a tapered bottom surface extending from the expanding channel to a peripheral portion of the chamber lid;
one or more gas conduits connected to an upper portion of the expanding channel, wherein the one or more gas conduits are connected at an angle orthogonal from a longitudinal axis of the expanding channel; and
one or more valves disposed below the expanding channel and coupled to the expanding channel via the one or more gas conduits.

12. The gas delivery assembly of claim 11, wherein the one or more gas conduits are angled downwardly.

13. The gas delivery assembly of claim 11, wherein the one or more gas conduits are disposed normal to the longitudinal axis of the expanding channel.

14. The gas delivery assembly of claim 11, wherein the tapered bottom surface comprises a surface selected from the group consisting of a straight surface, a concave surface, a convex surface, or combinations thereof.

15. The gas delivery assembly of claim 11, wherein the expanding channel is shaped as a truncated cone.

16. The gas delivery assembly of claim 11, wherein the expanding channel comprises an upper portion and a lower portion, the upper portion having a smaller inner diameter than the lower portion.

17. The gas delivery assembly of claim 11, wherein a common gas source is coupled to each valve and wherein separate gas sources are coupled to each valve.

18. The gas delivery assembly of claim 11, further comprising a choke disposed on the chamber lid adjacent a perimeter of the bottom surface.

19. A chamber, comprising:
a substrate support at least partially disposed within a chamber body and having a substrate receiving surface;
a chamber lid comprising an expanding channel extending downwardly from a central axis of the chamber lid and a tapered bottom surface extending radially from the central axis of the chamber lid from the expanding channel to a peripheral portion of the chamber lid, the tapered bottom surface shaped and sized to substantially cover the substrate receiving surface, wherein the expanding channel and the tapered bottom surface are disposed symmetrically about the central axis;
one or more valves in fluid communication with the expanding channel, each of the one or more valves having a diaphragm; and
one or more gas sources in fluid communication with each valve, wherein the diaphragm moves from an open position to a closed position, or from a closed position to an open position, in about 1.0 seconds or less.

20. The chamber of claim 19, further comprising one or more gas conduits fluidly connecting the one or more valves and the expanding channel and disposed normal to the central axis of the expanding channel.

21. The chamber of claim 19, wherein the one or more gas conduits are disposed at an angle to the central axis of the expanding channel.

22. The chamber of claim 19, wherein the tapered bottom surface comprises a surface selected from the group consisting of a straight surface, a concave surface, a convex surface, or combinations thereof.

23. The chamber of claim 19, wherein the expanding channel is shaped as a truncated cone.

24. The chamber of claim 19, wherein the diaphragm moves from the open position to the closed position, or from the closed position to the open position, in about 0.5 seconds or less.

25. The chamber of claim 1, wherein each of the one or more valves have a diaphragm that moves from an open position to a closed position, or from a closed position to an open position, in about 1.0 seconds or less.

26. The chamber of claim 9, wherein each of the one or more valves have a diaphragm that moves from an open position to a closed position, or from a closed position to an open position, in about 1.0 seconds or less.

* * * * *

UNITED STATES PATENT AND TRADEMARK OFFICE
CERTIFICATE OF CORRECTION

| | | |
|---|---|---|
| PATENT NO. | : 7,780,785 B2 | Page 1 of 1 |
| APPLICATION NO. | : 10/281079 | |
| DATED | : August 24, 2010 | |
| INVENTOR(S) | : Chen et al. | |

It is certified that error appears in the above-identified patent and that said Letters Patent is hereby corrected as shown below:

Page 5 Line 21 In the References Cited (56):

Please delete "WO 01/06832 9/2001" and insert --WO 01/66832 9/2001-- therefor;

In the Detailed Description of the Preferred Embodiment:

Column 12, Line 13, please delete "a" and insert --α-- therefor;

Column 12, Line 19, please delete "a" and insert --α-- therefor;

Column 12, Line 38, please delete "a" and insert --α-- therefor;

Column 12, Line 50, please delete "a" and insert --α-- therefor;

Column 12, Line 54, please delete "a" and insert --α-- therefor.

Signed and Sealed this
Twenty-eighth Day of December, 2010

David J. Kappos
*Director of the United States Patent and Trademark Office*